(12) United States Patent
Deley et al.

(10) Patent No.: US 7,931,186 B2
(45) Date of Patent: Apr. 26, 2011

(54) METHOD OF TEACHING EYEPOINTS FOR WIRE BONDING AND RELATED SEMICONDUCTOR PROCESSING OPERATIONS

(75) Inventors: Michael T. Deley, Warrington, PA (US);
Peter M. Lister, Warrington, PA (US);
Deepak Sood, New Britain, PA (US);
Zhijie Wang, Chalfont, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 12/093,403

(22) PCT Filed: Mar. 13, 2007

(86) PCT No.: PCT/US2007/063850
§ 371 (c)(1),
(2), (4) Date: May 12, 2008

(87) PCT Pub. No.: WO2008/111977
PCT Pub. Date: Sep. 18, 2008

(65) Prior Publication Data
US 2010/0181365 A1 Jul. 22, 2010

(51) Int. Cl.
*B23K 31/00* (2006.01)
*B23K 11/00* (2006.01)
(52) U.S. Cl. ........ 228/180.5; 228/4.5; 228/904; 219/56; 219/56.1; 219/85.18
(58) Field of Classification Search ............ 228/4.5, 228/180.5, 904; 219/56, 56.1, 85.18
See application file for complete search history.

(56) References Cited

U.S. PATENT DOCUMENTS

| | | | |
|---|---|---|---|
| 4,441,205 A * | 4/1984 | Berkin et al. ............ | 382/151 |
| 4,651,341 A | 3/1987 | Nakashima et al. | |
| 4,759,073 A * | 7/1988 | Shah et al. ............ | 382/151 |
| 5,119,435 A | 6/1992 | Berkin | |
| 5,119,436 A | 6/1992 | Holdgrafer | |
| 5,125,036 A | 6/1992 | Raghavan et al. | |
| 5,600,733 A * | 2/1997 | MacDonald et al. ...... | 382/144 |
| 6,465,898 B1 | 10/2002 | Hnilo et al. | |
| 6,869,869 B2 | 3/2005 | Roberts et al. | |
| 2001/0036306 A1 | 11/2001 | Wienecke | |
| 2001/0053244 A1 | 12/2001 | Kim et al. | |
| 2002/0019066 A1 | 2/2002 | Iketani | |
| 2004/0159952 A1 | 8/2004 | Nin | |

FOREIGN PATENT DOCUMENTS

EP 0634791 A2 1/1995

OTHER PUBLICATIONS

Kulicke & Soffa Industries, Inc., Willow Grove, PA 19090; Model 1488 Plus, Automatic Gold Ball Bonder; vol. 1: Operation Manual, Software Version 7.xx; Oct. 1996; pp. 5-1 through 5-22.
International Search Report dated Mar. 19, 2008, International Application No. PCT/US2007/063850.

* cited by examiner

*Primary Examiner* — Kevin P Kerns
*Assistant Examiner* — Devang R Patel
(74) *Attorney, Agent, or Firm* — Christopher M. Spietzer, Sr.

(57) ABSTRACT

A method of teaching an eyepoint for a wire bonding operation is provided. The method includes (1) selecting a group of shapes from a region of a semiconductor device for use as an eyepoint, and (2) teaching the eyepoint to a wire bonding machine using at least one of (a) a sample semiconductor device, or (b) predetermined data related to the semiconductor device. The teaching step includes defining locations of each of the shapes with respect to one another.

21 Claims, 22 Drawing Sheets

METHOD OF TEACHING EYEPOINTS FOR WIRE BONDING AND RELATED SEMICONDUCTOR PROCESSING OPERATIONS

CROSS REFERENCE

This application is a U.S. National Phase application of PCT Application No. PCT/US2007/063850, filed on Mar. 13, 2007, the content of which is incorporated by reference in its entirety.

FIELD OF THE INVENTION

The present invention relates to wire bonding systems, and more particularly, to improved eyepoint teaching methods for use in wire bonding systems.

BACKGROUND OF THE INVENTION

U.S. Pat. Nos. 5,119,436 and 6,869,869 relate to wire bonding systems and associated vision systems, and are hereby incorporated by reference in their entirety.

In the processing and packaging of semiconductor devices, teaching operations using vision systems are often utilized. For example, before a wire bonding operation is performed on a batch of semiconductor devices (e.g., devices such as a semiconductor die mounted on a leadframe), it is typically desired to "teach" an eyepoint (or multiple eyepoints) of a sample device. By "teaching" the sample device, certain physical data related to the sample device is stored (e.g., in the memory of a wire bonding machine). This physical data is used as a reference during processing of the batch of devices, for example, to ensure proper positioning or alignment of each of the batch of semiconductor devices to be processed (e.g., to be wire bonded).

Thus, in the context of a wire bonding operation, a wire bonding machine uses a vision system (e.g., a Pattern Recognition System or PRS) to find a previously taught pattern (e.g., an eyepoint, a fiducial, etc.) for aligning a semiconductor device after it is presented at the bond site and before the wires are bonded (e.g., before the wires are bonded between the semiconductor device and a leadframe supporting the semiconductor device). Traditionally, an eyepoint is taught on the wire bonding machine based on a sample device where an operator targets an area on the sample device with a teach window. Certain conventional techniques (e.g., algorithms) are used in conjunction with a vision system to scan the targeted eyepoint.

One conventional teaching technique relates to scanning the sample device (e.g., a selected portion of the sample device) using a normalized grayscale correlation system (i.e., NGCS). Through such a technique, grayscale values are assigned based on what a vision system detects is present at each location. For example, when a bond pad of a semiconductor device is scanned grayscale values are assigned to the scanned location. After the desired region is scanned, a library of grayscale values (associated with corresponding scanned positions) is stored. When the actual semiconductor devices of this type are to be wire bonded, the vision system detects the grayscale values at each of the scanned locations and compares these grayscale values to those stored in the library during the teaching process.

Another conventional teaching technique relates to scanning the sample device (e.g., a selected portion of the sample device) and detecting individual edges defined within the scanned region (i.e., edge-based pattern matching). Through such a technique, values are defined based on what a vision system detects is present at each location. For example, when a bond pad of a semiconductor device is scanned an edge value is assigned to the scanned location. After the desired region is scanned, a library of edge values (associated with corresponding scanned positions) is stored. When the actual semiconductor devices of this type are to be wire bonded, the vision system detects the edge values at each of the scanned locations and compares these values to those stored in the library during the teaching process.

Using either of these conventional methods, a weighted score is given to each device to be wire bonded, where the score is a function of a comparison of the taught sample device to the actual device to be wire bonded. If the score exceeds a certain threshold value, the device is acceptable and will be processed (e.g., wire bonded); however, if the score is below the threshold value, automatic operation typically does not continue. For example, the operator may be notified of the low score. Further, a subsequent location or eyepoint may be attempted to obtain an acceptable score. Further still, an alternate algorithm or recovery sequence may be attempted.

Unfortunately, there are a number of problems associated with each of these conventional techniques. A practical reality of semiconductor devices is that different devices from the same batch (or different batches) may exhibit different visual properties even though they are considered to be the same device and have the same electrical functional properties. For example, the surface color or texture may vary from device to device. Such variations may arise due to slightly different fabrication processes used by the different suppliers of the same device. Such variations often result in devices that appear quite different from each other in terms of contrast and reflectivity (e.g., non-linear variations in reflectivity). Thus, the weighted scores that result from conventional pattern matching techniques may be lower because of such variations (e.g., due to the differences in reflectivity of the devices to be wirebonded when compared to the sample taught device). Therefore, although scores are typically used to omit false finds, conventional pattern matching techniques (e.g., NGCS systems, edge-based pattern matching systems, etc.) tend to result in scores below the threshold value even if the device is acceptable for further processing. Another problem resulting from such variations amongst semiconductor devices (e.g., surface variations among the devices) may be an undesirably low mean time between assists (i.e., MTBA), leading to lower productivity of the automatic wire bonding equipment.

Thus, it would be desirable to provide improved methods of teaching eyepoints for semiconductor device processing, and improved methods of processing semiconductor devices using the eyepoints.

SUMMARY OF THE INVENTION

According to an exemplary embodiment of the present invention, a method of teaching an eyepoint for a wire bonding operation is provided. The method includes (1) selecting a group of shapes from a region of a semiconductor device for use as an eyepoint, and (2) teaching the eyepoint to a wire bonding machine using at least one of (a) a sample semiconductor device, or (b) predetermined data related to the semiconductor device. For example, such predetermined data may be a priori data (e.g., CAD data, historical data, etc.), or may be predetermined in that it is determined just prior to the teaching step. The teaching step includes defining locations of each of the shapes with respect to one another.

According to another exemplary embodiment of the present invention, a method of operating a wire bonding machine is provided. The method includes (1) selecting a group of shapes from a region of a semiconductor device for use as an eyepoint, and (2) teaching the eyepoint to the wire bonding machine using at least one of (a) a sample semiconductor device, or (b) predetermined data related to the semiconductor device. The teaching step includes defining locations of each of the shapes with respect to one another. The method also includes (3) indexing a first semiconductor device configured to be wire bonded into a predetermined position of the wire bonding machine, and (4) scanning selected portions of the first semiconductor device using a vision system of the wire bonding machine, the selected portions corresponding to the taught eyepoint.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
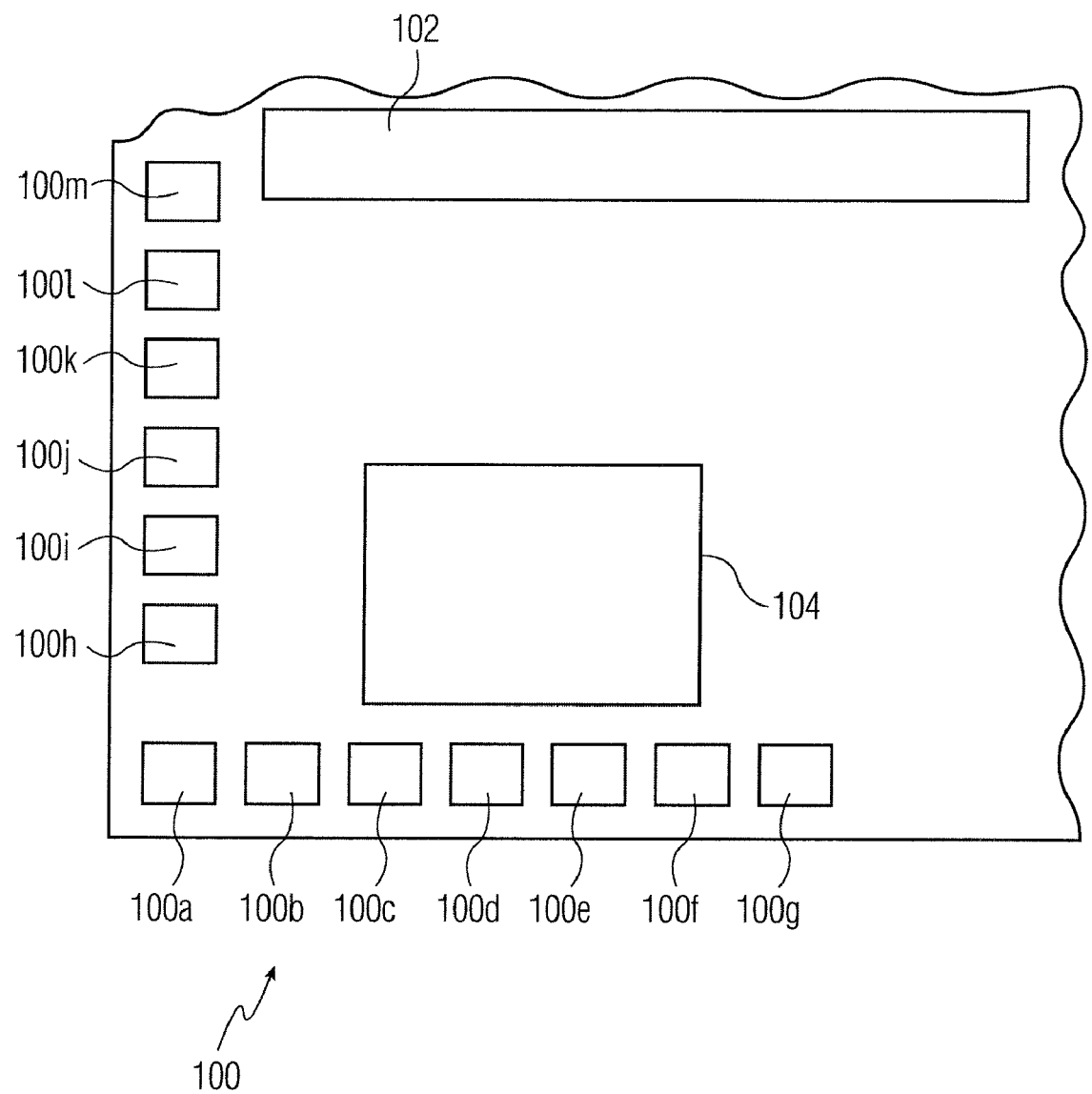
FIG. 1 is a top view of a portion of a semiconductor device in accordance with an exemplary embodiment of the present invention.

According to an exemplary embodiment of the present invention, a method for generating a geometric feature-based pattern used for positioning and/or alignment of semiconductor devices in wire bonding equipment is provided. The method defines a technique for generating an eyepoint using invariant features of the patterns on the semiconductor die surface. Such an approach increases the robustness of finding the pattern on semiconductor devices that have certain variations (e.g., variations in surface reflectivity). Further, the generated eyepoint may be constructed using synthetically created features (e.g., using a priori data such as CAD data) or can be extracted from the actual part image. Unlike traditional PRS systems (e.g., grayscale pattern matching, geometric pattern matching), the proposed method effectively captures the invariant features inside an image. A model (e.g., stored in the memory of the wire bonding machine) created using the invariant features (and the relationship of the invariant features with respect to one another) is more robust for handling device variations in an automated wire bonding production environment in comparison to conventional techniques.

Eyepoints generated using the various exemplary methods disclosed herein may be used as a primary eyepoint or backup eyepoint in a PRS, for example, using pad information (or other geometric or shape information) learned during the eyepoint teaching process. The generated eyepoint (and the region of the semiconductor die) may be selected (1) automatically by the PRS by choosing a region on the semiconductor device that has good pad geometric information (e.g., a region including a vertical row of pads and a horizontal row of pads), and/or (2) at least partially through operator intervention in choosing this region with desirable pad information.

In an example where the PRS automatically generates the eyepoint, shapes (e.g., bond pad shapes of any type such as rectangular, octagonal, round, etc.) and relative locations of the shapes may be obtained from the device data (e.g., CAD data) through an off-line programming tool or the like. Alternatively, such shapes (and relative locations of the shapes) may be extracted automatically, using a vision system, after observing the sample device. If a sufficiently complete digital description of the semiconductor die (i.e., predetermined device data) is available, an algorithm may be used to select appropriate shapes/features for inclusion in the eyepoint, and then the algorithm may be used to bind the selected shapes/features together (e.g., using the relative positions of the shapes/features). Using such a method a "visionless teach" process (i.e., an offline programming method) is provided which utilizes little or no learning activity on the wire bonder itself. Of course, it may be desired to confirm an eyepoint taught using such an offline program with a sample device on the wire bonding machine. In such a visionless teach system, it may be possible to reduce the requirements of the optical system of a wire bonding machine. This is because wire bonding machines often employ complex vision systems, sometimes with varying levels of magnification, in order to perform the teach operation; however, if the teach operation were performed in a visionless manner using pre-existing data, the complexity (and cost) of the vision system may be reduced. For example, in a wire bonding machine that conventionally uses two magnification levels (two optical systems such as a "high magnification system" and a "low magnification system"), the high magnification system may be able to be omitted from the wire bonding machine. This may be the case because the high magnification system is often used to obtain detailed views of taught area, such as the small (e.g., sub-pixel sized) gaps between adjacent bond pads. According to certain exemplary embodiments of the present invention, using a "visionless" teaching process such detail may not be desired (e.g., because of the cost of the high magnification system).

In an example where operator intervention is utilized in generating the eyepoint, the operator may be assisted by an accurate motion system and a calibrated PRS. For example, the motion system and PRS system may perform a teaching process (e.g., a bond pad teaching process) based on parameters provided by the operator. Such a method may be utilized, for example, (1) when no adequate description of the semiconductor device is available, and/or (2) when features without a well defined geometry are to be included in the eyepoint. Such a teaching process may involve, for example, moving to each of the desired shapes/features in turn and acquiring the desired data from an image of the desired shape/feature. Once all of the shapes/features have been taught, an eyepoint may be established using the combination of the taught shapes/features and their respective locations/positions within an established frame of reference.

Regardless of how the eyepoint is generated, after the teaching process, shape information such as bond pad size, bond pad location, shape, polarity and other properties are available inside the PRS system. Further, besides the individual shape information (e.g., individual bond pad shape information), the geometric relationship between those shapes (e.g., between those bond pads) may also be obtained from the motion system and/or calculated using the PRS system.

As suggested above, in the taught region (e.g., the eyepoint), synthetically created shapes/pads could replace information regarding real shapes/pads (i.e., image based pad models). More specifically, such synthetically created shapes/pads are provided by using available data related to the semiconductor device (e.g., a priori data such as CAD data). Such synthetically created shapes/pads may give a better representation of an average shape/pad because it contains all the generalized characteristics of numerous shapes/pads (and perhaps without certain defects of a sample device that may otherwise be used to teach an eyepoint). Further, proper masking techniques may be used to eliminate certain areas of the selected region of the semiconductor device that tend to change from device to device. Further still, a technique which gives more weight to a certain region of the semiconductor device (e.g., a peripheral pad area of the die) as opposed to other areas of the device may be used to make the eyepoint more robust.

The shapes included in the generated eyepoints according to the present invention include, for example, bond pad shapes, groups of bond pads that form a pattern, traditional eyepoint shapes (e.g., a cross, a circle, a square, etc.), circuitry with a defined shape, and/or arbitrary surface features on the die that are distinct, amongst others. Further, two or more of these (or other) exemplary shapes may be combined for inclusion in the generated eyepoint.

The algorithm used to establish the eyepoint may include a number of different strategies, for example, (1) a minimum number of shapes/features may be predetermined in an algorithm, and when this predetermined number of shapes/features has been taught, the algorithm may move to another portion of the process such as calculating the location of the taught shapes/features with respect to a frame of reference and/or with respect to each other; (2) defining certain shapes/features as required during the teach process such that a failure to locate such features may result in a failure to define the eyepoint; (3) employing a weighting system such that certain shapes/features are given weights based on their respective criticalities or predictabilities where such a weighting system is used to define a score of a semiconductor device to be processed; (4) if all of the desired shapes/features selected for inclusion in the eyepoint fit within a single field of view of the vision system (e.g., the imaging camera) then a single find operation may be used to locate the eyepoint; (5) if the desired features can not fit the field of view, individual features (e.g., individual bond pads of the eyepoint) may be located after which a complete taught pattern (e.g., including the relative locations of the individual features) can be obtained from combining the data of the individually located features; and/or (6) applying multiple (and perhaps redundant) teach algorithms during the teach phase to improve reliability. Any combination of these strategies (amongst others) may be employed within the scope of the present invention.

FIG. 1 is a top view of a portion of semiconductor device 100 (the illustrated portion is the lower left hand portion of a semiconductor die as viewed from above). Semiconductor device 100 includes a number of bond pads arranged about the periphery of the device. For example, such bond pads include bond pads 100$a$, 100$b$, 100$c$, 100$d$, 100$e$, 100$f$, 100$g$, 100$h$, 100$i$, 100$j$, 100$k$, 100$l$, and 100$m$. Semiconductor device 100 also includes circuit region 102 and circuit region 104. As is known to those skilled in the art, circuit regions on a semiconductor device (e.g., a semiconductor die) may include wiring patterns, conductive traces, and the like.

In order to process semiconductor device 100 on a wire bonding machine (e.g., in order to bond wire loops between bond pads of device 100 and a second bonding location, where the second bonding location may be leads on a leadframe on which device 100 is mounted), it is desirable to align semiconductor device 100 on the wire bonding machine using an eyepoint(s) previously taught to the wire bonding machine. Of course, the desire for such alignment applies to various other semiconductor processing techniques including, for example, stud bumping, die to die wire bonding, inspection of wire bumps/loops, etc.

Figure 2:
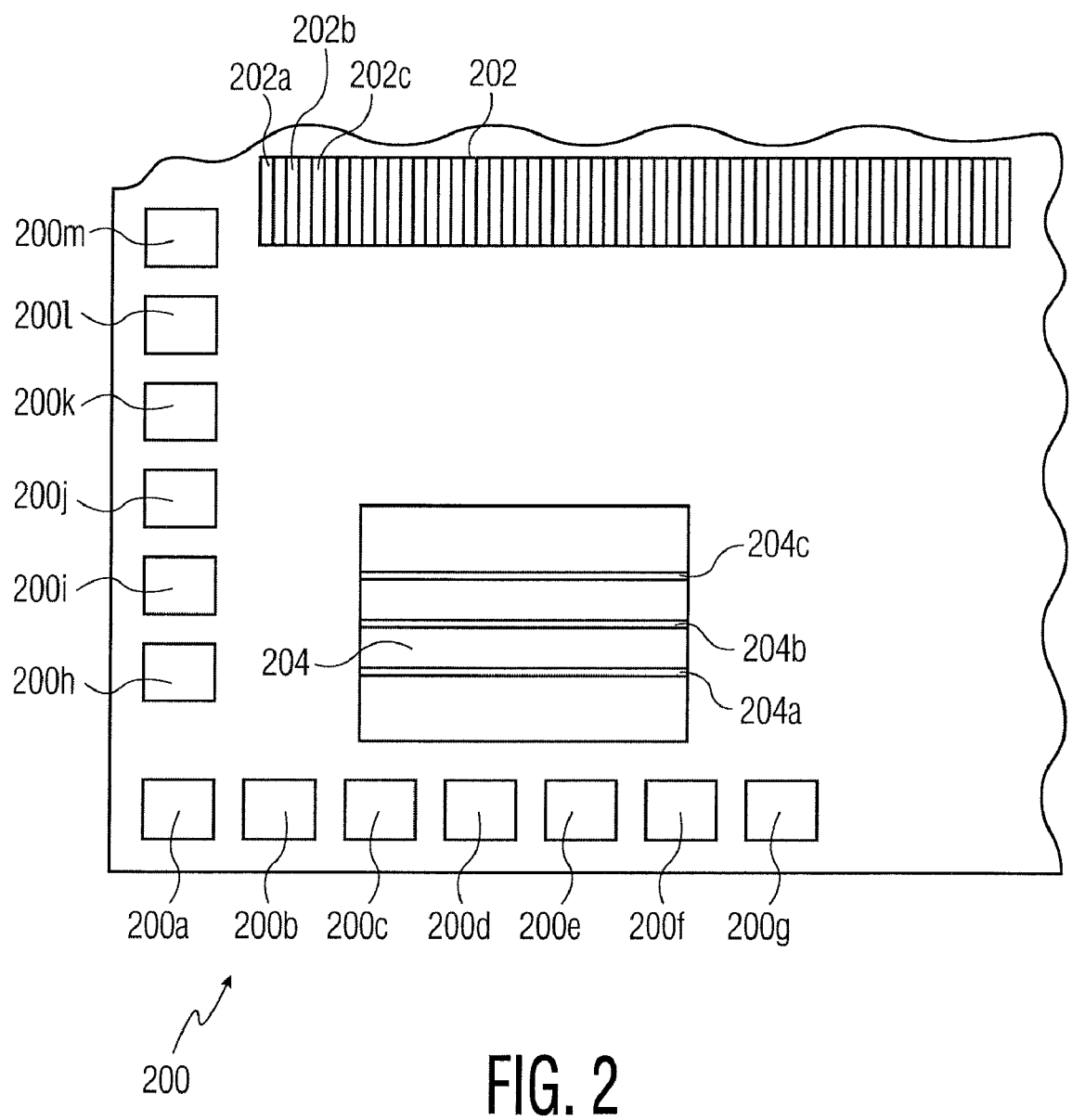
FIG. 2 is a top view of a portion of another semiconductor device in accordance with an exemplary embodiment of the present invention.

As discussed above, a practical reality of semiconductor devices is that different devices may exhibit different properties even though they are considered to be the same device. For example, FIG. 2 is a top view of a portion of another semiconductor device 200. Semiconductor device 200, while provided by a different manufacturer than device 100 of FIG. 1, is considered to be the same device as semiconductor device 100 illustrated in FIG. 1 from the perspective of a wire bonding machine. Similar to the bond pads of semiconductor device 100, semiconductor device 200 includes a number of bond pads such as bond pads 200a, 200b, 200c, 200d, 200e, 200f, 200g, 200h, 200i, 200j, 200k, 200l, and 200m. Further, similar to circuit regions 102 and 104 of semiconductor device 100, semiconductor device 200 includes circuit regions 202 and 204. From the viewpoint of a vision system, circuit regions 102 and 104 of semiconductor device 100 appear as single components or regions having a common physical appearance; however, because of variations in the surface of the two devices (i.e., devices 100 and 200), the same vision system may see circuit regions 202 and 204 of semiconductor device 200 as including numerous discrete portions. For example, as shown in FIG. 2, circuit region 202 is viewed as including portions 202a, 202b, and 202c (amongst others). Likewise, circuit region 204 includes portions 204a, 204b, and 204c (amongst others).

Thus, while semiconductor device 100 and semiconductor device 200 are operationally the same, because of one of a number of potential reasons (e.g., surface color, surface texture, etc.), the vision system sees them as quite different. Now, assume that an eyepoint for a wire bonding operation is taught using a portion semiconductor device 100 including circuit region 102 or 104. When it is time to process (e.g., wire bond) semiconductor device 200 using the eyepoint taught from semiconductor device 100, a number of potential problems may result (e.g., the score for semiconductor device 200 being below a threshold value even though the device is acceptable for further processing, an undesirably low MTBA for devices such as semiconductor device 200, etc.).

According to certain exemplary embodiments of the present invention, an eyepoint is selected with the intention that the eyepoint does not vary from device to device, regardless of differences in surface color/texture and the like. For example, a group of shapes from a region of a semiconductor device may be selected for use as an eyepoint. When teaching the eyepoint to a wire bonding machine using a sample semiconductor device, locations of each of the shapes with respect to one another is defined.

Figure 3:
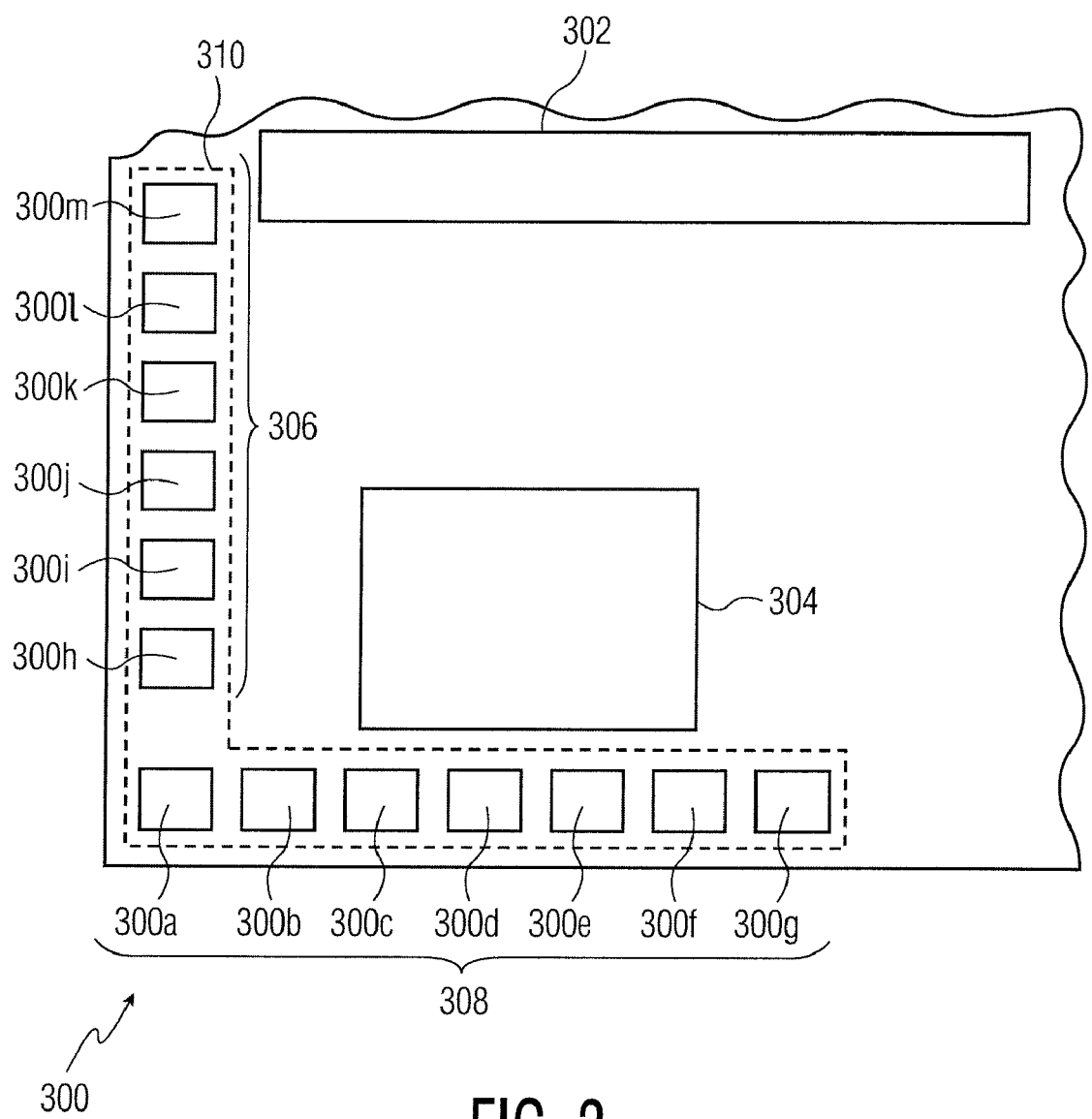
FIG. 3 is a top view of a portion of another semiconductor device including an eyepoint in accordance with an exemplary embodiment of the present invention.

For example, FIG. 3 illustrates such an eyepoint selection in accordance with an exemplary embodiment of the present invention. FIG. 3 illustrates semiconductor device 300 including a number of bond pads such as bond pads 300a, 300b, 300c, 300d, 300e, 300f, 300g, 300h, 300i, 300j, 300k, 300l, and 300m. Further, similar to circuit regions 102/104 and 202/204 of semiconductor devices 100/200 respectively, semiconductor device 300 includes circuit regions 302 and 304. Because of the potential for circuit regions 302 and 304 varying from device to device (as evidenced by comparing devices 100 and 200), these regions are omitted from selected eyepoint 310. Eyepoint 310 includes bond pad group 306 (a column of bond pads including bond pads 300h, 300i, 300j, 300k, 300l, and 300m) and bond pad group 308 (a row of bond pads including bond pads 300a, 300b, 300c, 300d, 300e, 300f, 300g). Certain features of eyepoint 310 (e.g., an outline shape of each of the bond pads, the spacing of the bond pads with respect to one another, etc.) do not tend to vary from device to device, and as such, a more robust teach process (and a more robust subsequent scan of actual devices to be wirebonded) is provided.

It is noteworthy that while the eyepoint is referred to above as eyepoint 310 (which is the region within the dotted line in FIG. 3), it is understood that eyepoint 310 may only include certain shapes/features within the region such as bond pad shapes and the respective locations of certain bond pads within region 310. This is true for the various exemplary embodiments of the present invention illustrated and described herein.

Further, while exemplary eyepoint 310 includes the bond pad shapes of the bond pads in groups 306 and 308 (and excludes the shapes of circuit regions 302 and 304), an outline shape of one or both of circuit regions 302 and 304 could be included in the eyepoint. In such an eyepoint, the potential internal differences between the circuit regions that may exist from device to device (e.g., the differences between circuit region 102 in FIG. 1 as compared to circuit region 202 in FIG. 2) may not affect the teaching process (and subsequent find process) because only an outline shape of the circuit region is included in the eyepoint.

In some applications, semiconductor device bond pads may include "probe marks" that are visible to the vision system of a wire bonding machine. Such probe marks do not tend to be uniform. For example, because of the manner in which semiconductor wafers are typically tested, some of the probe marks may extend in one direction (e.g., horizontal) while others of the probe marks may extend in another direction (e.g., vertical). These variations of the probe marks on bond pads may also cause problems in conventional eyepoint teaching systems (e.g., low find score problems, MTBA problems, etc.).

According to certain exemplary embodiments of the present invention, an interior region of the bond pads is ignored/excluded from the eyepoint such that problems associated with certain variations (e.g., probe marks) is substantially limited. For example, such regions may be (1) scanned but not considered during the scoring process, (2) scanned but given relatively little weight during the scoring process, and/or (3) not scanned at all. Thus, it is clear that the terms "excluded", "omitted", "precluded", and/or "masked" (or similar terms), when referring to certain areas of a device (e.g., shaded regions such as the interior of bond pads or other shaded regions), does not necessarily mean that the areas are excluded from a scanning process (e.g., a scanning process during teaching, a scanning process during processing of an actual device to be wirebonded, etc.).

Figure 4:
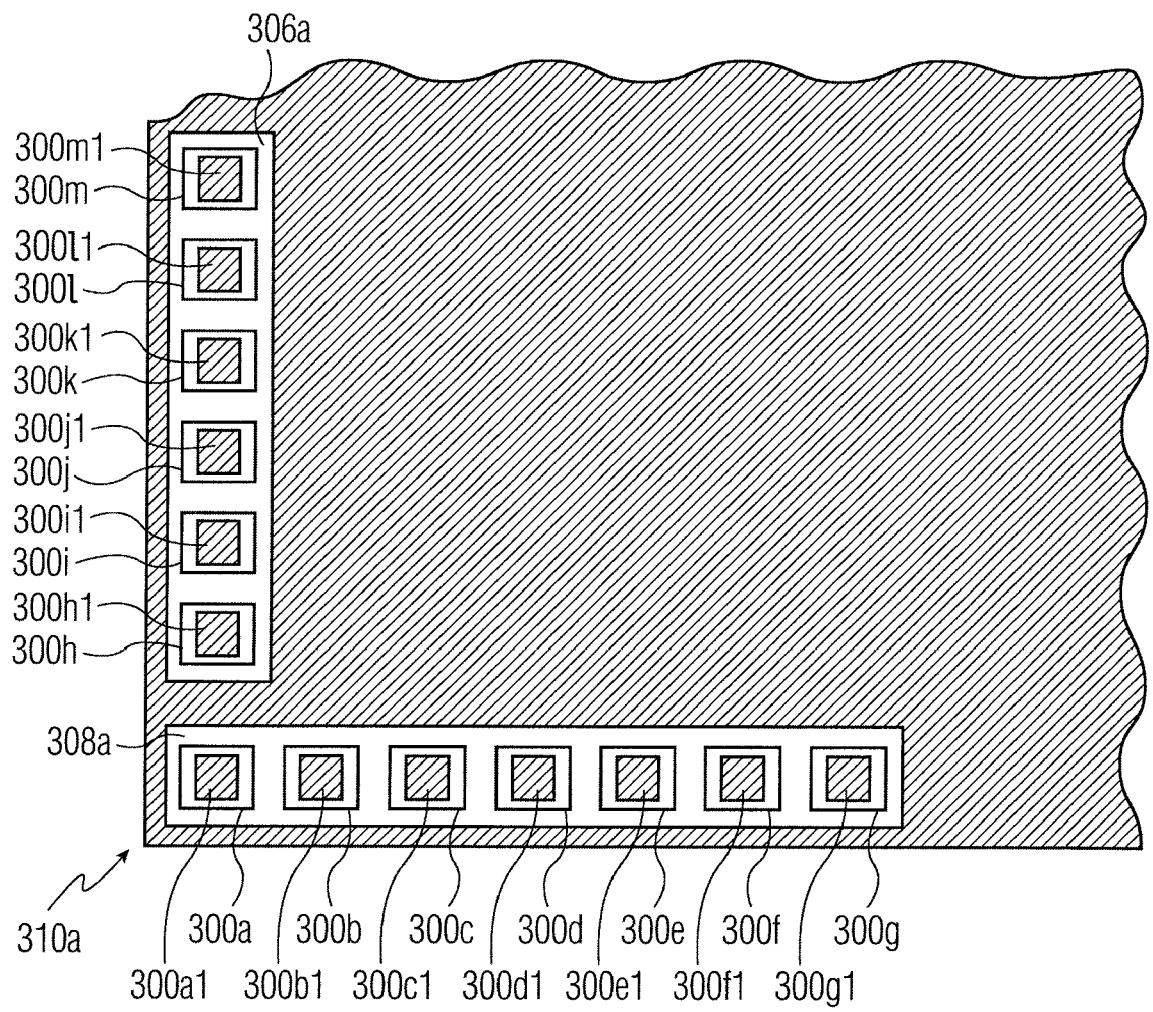
FIG. 4 is a top view of the portion of the semiconductor device of FIG. 3 with certain areas masked in accordance with an exemplary embodiment of the present invention.

Thus, FIG. 4 illustrates semiconductor device 300 with certain selected (e.g., predetermined, dynamically determined in real-time, etc.) regions omitted from eyepoint 310a (in contrast to eyepoint 310 which has certain differences from eyepoint 310a, such as, eyepoint 310 does not omit the interior of the bond pads from the eyepoint). These selected regions are shaded/hatched in FIG. 4 (i.e., the shaded regions may be "masked" from the eyepoint teach process, for example, where (1) an algorithm is configured to not scan these regions, and/or (2) the algorithm is configured such that the presence of edges/features within the "masked" region does not contribute to the overall score calculation). As shown in FIG. 4, an interior of each of the bond pads is shaded such that the interior is excluded from the taught eyepoint. More specifically, interior 300a1 of bond pad 300a is omitted from eyepoint 310a. The same is true for interior 300b1 of bond pad 300b, interior 300c1 of bond pad 300c, interior 300d1 of bond pad 300d, interior 300e1 of bond pad 300e, interior 300f1 of bond pad 300f, interior 300g1 of bond pad 300g, interior 300h1 of bond pad 300h, interior 300i1 of bond pad 300*i*, interior 300*j*1 of bond pad 300*j*, interior 300*k*1 of bond pad 300*k*, interior 300*l*1 of bond pad 300*l*, and interior 300*m*1 of bond pad 300*m*.

In order to provide a small margin of error, and an area to locate the shapes, for (1) teaching the bond pads of eyepoint 310*a* (e.g., the shapes and respective locations of the bond pads in eyepoint 310*a*), and (2) later scanning of eyepoint 310*a*, a region beyond the actual bond pads is also included in eyepoint 310*a*. More specifically, a non-shaded region 306*a* is provided surrounding bond pad column 306, and a non-shaded region 308*a* is provided surrounding bond pad row 308. By providing these surrounding regions, the likelihood of teaching the exact outline location of each of the bond pads (and their outline location with respect to each other) in an eyepoint is increased.

Figure 5:
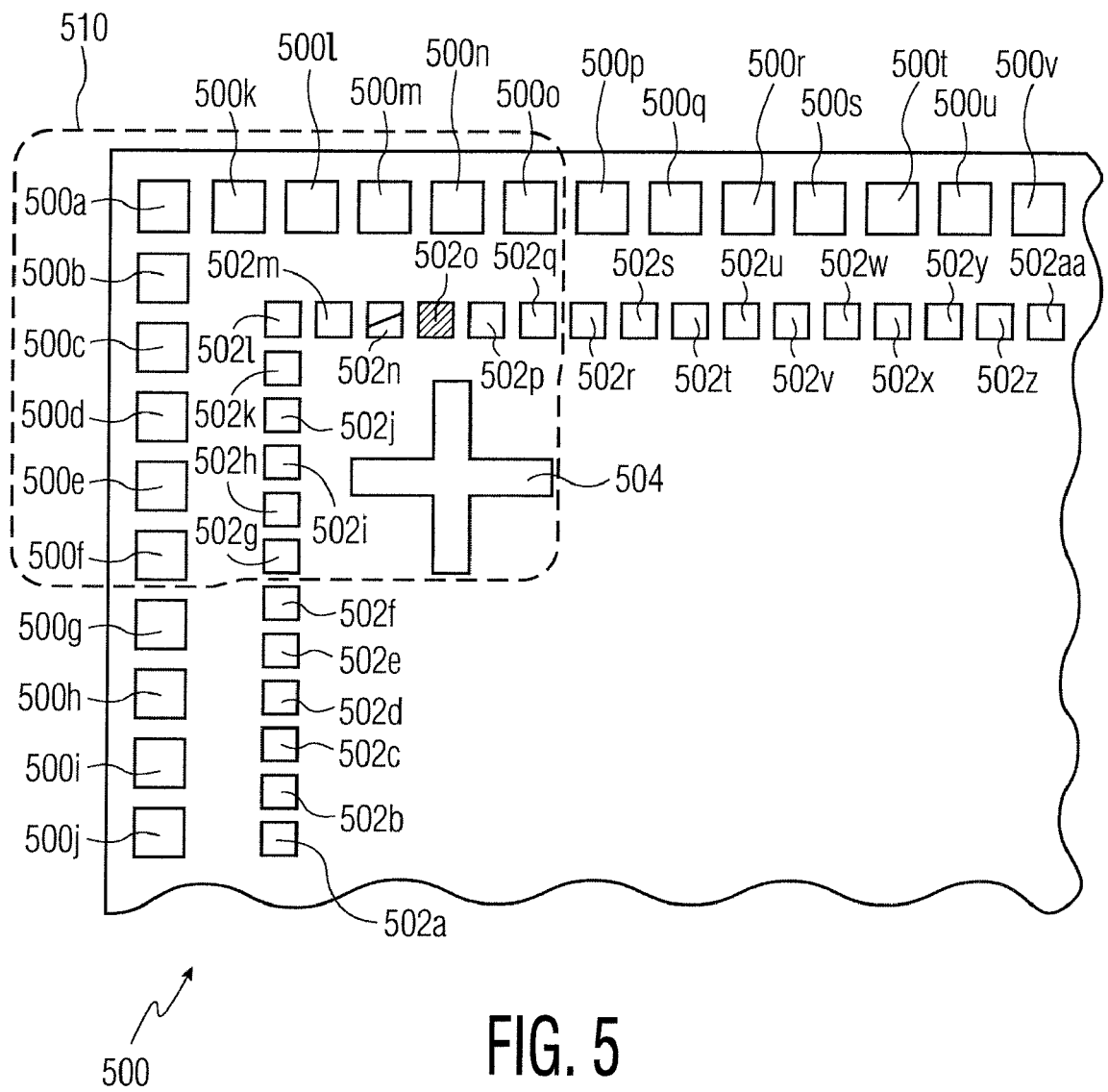
FIG. 5 is a top view of a portion of another semiconductor device including an eyepoint in accordance with an exemplary embodiment of the present invention.

FIG. 5 is a top view of a portion of semiconductor device 500 including region 510 selected to include an eyepoint in accordance with an exemplary embodiment of the present invention. Semiconductor device 500 includes a number of bond pads. As illustrated in FIG. 5, a first group of bond pads (including bond pads 500*a*, 500*b*, 500*c*, 500*d*, 500*e*, 500*f*, 500*g*, 500*h*, 500*i*, 500*j*, 500*k*, 500*l*, 500*m*, 500*n*, 500*o*, 500*p*, 500*q*, 500*r*, 500*s*, 500*t*, 500*u*, and 500*v*) are provided about a periphery of semiconductor device 500, while a second group of bond pads (including bond pads 502*a*, 502*b*, 502*c*, 502*d*, 502*e*, 502*f*, 502*g*, 502*h*, 502*i*, 502*j*, 502*k*, 502*l*, 502*m*, 502*n*, 502*o*, 502*p*, 502*q*, 502*r*, 502*s*, 502*t*, 502*u*, 502*v*, 502*w*, 502*x*, 502*y*, 502*z*, and 502*aa*) are provided inside the first group. Semiconductor device 500 also includes fiducial 504.

Figure 6:
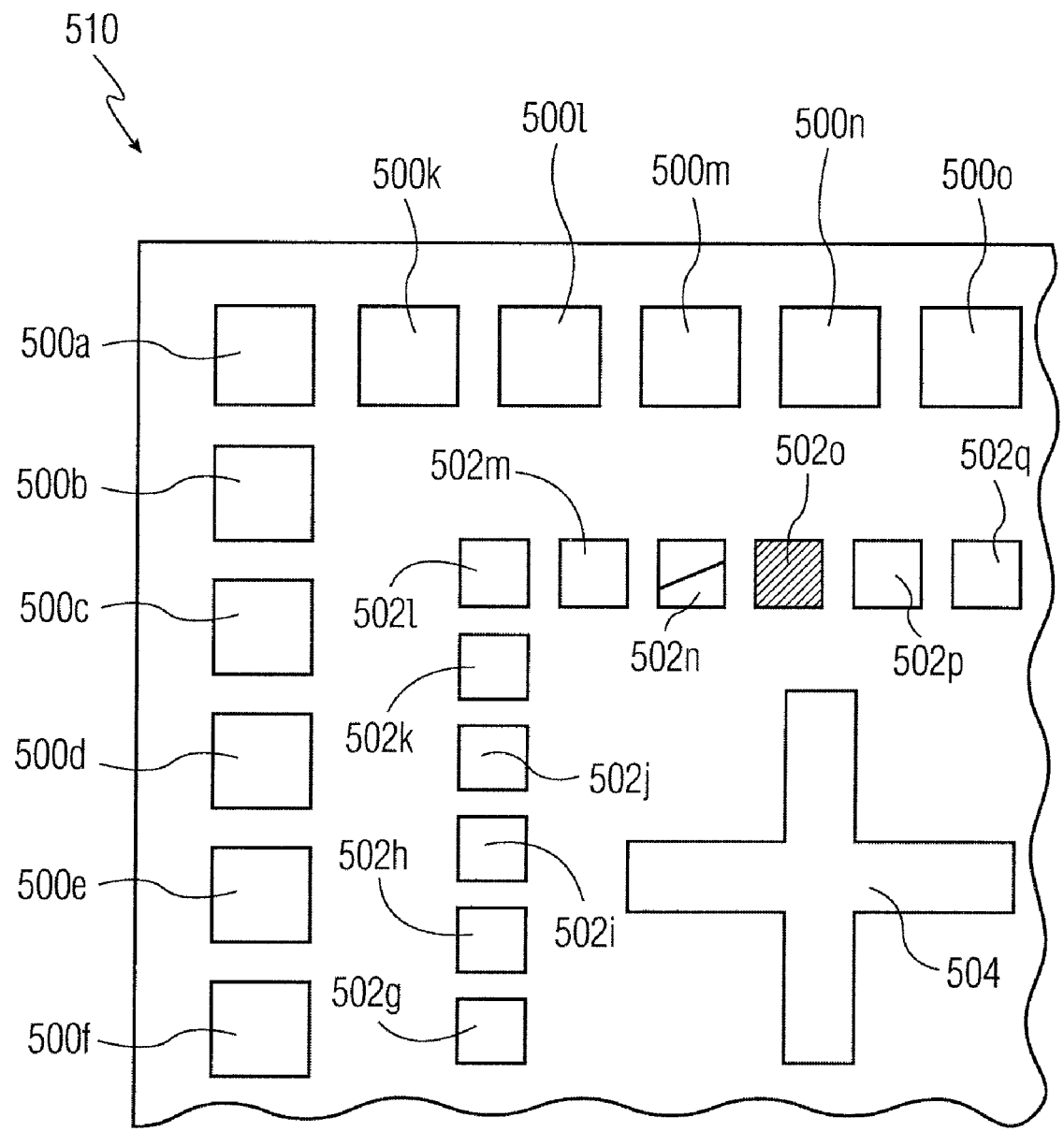
FIG. 6 is a top view of a portion of the semiconductor device of FIG. 5 selected as an eyepoint in accordance with an exemplary embodiment of the present invention.

FIG. 6 is a detailed view of region 510 of semiconductor device 500 selected to include an eyepoint of semiconductor device 500. Region 510 includes bond pads 500*a*, 500*b*, 500*c*, 500*d*, 500*e*, 500*f*, 500*k*, 500*l*, 500*m*, 500*o*, 502*g*, 502*h*, 502*i*, 502*j*, 502*k*, 502*l*, 502*m*, 502*n*, 502*o*, 502*p*, 502*q* and fiducial 504. Note that bond pads 502*n* and 502*o* include some type of aberration that may be visible to a vision system performing a scan of the bond pad (e.g., a blemish, varying reflectivity, a visible flaw, etc.). If semiconductor device 500 (including the aberrations of bond pads 502*n* and 502*o*) is used as a sample device to teach an eyepoint to a wire bonding machine, when it is time to process (e.g., wire bond) an actual semiconductor device using the eyepoint taught from semiconductor device 500, a number of potential problems may result (e.g., the score for semiconductor device to be processed being below a threshold value even though the device is acceptable for further processing, an undesirably low MTBA for devices such as semiconductor device 500, etc.).

Figure 7:
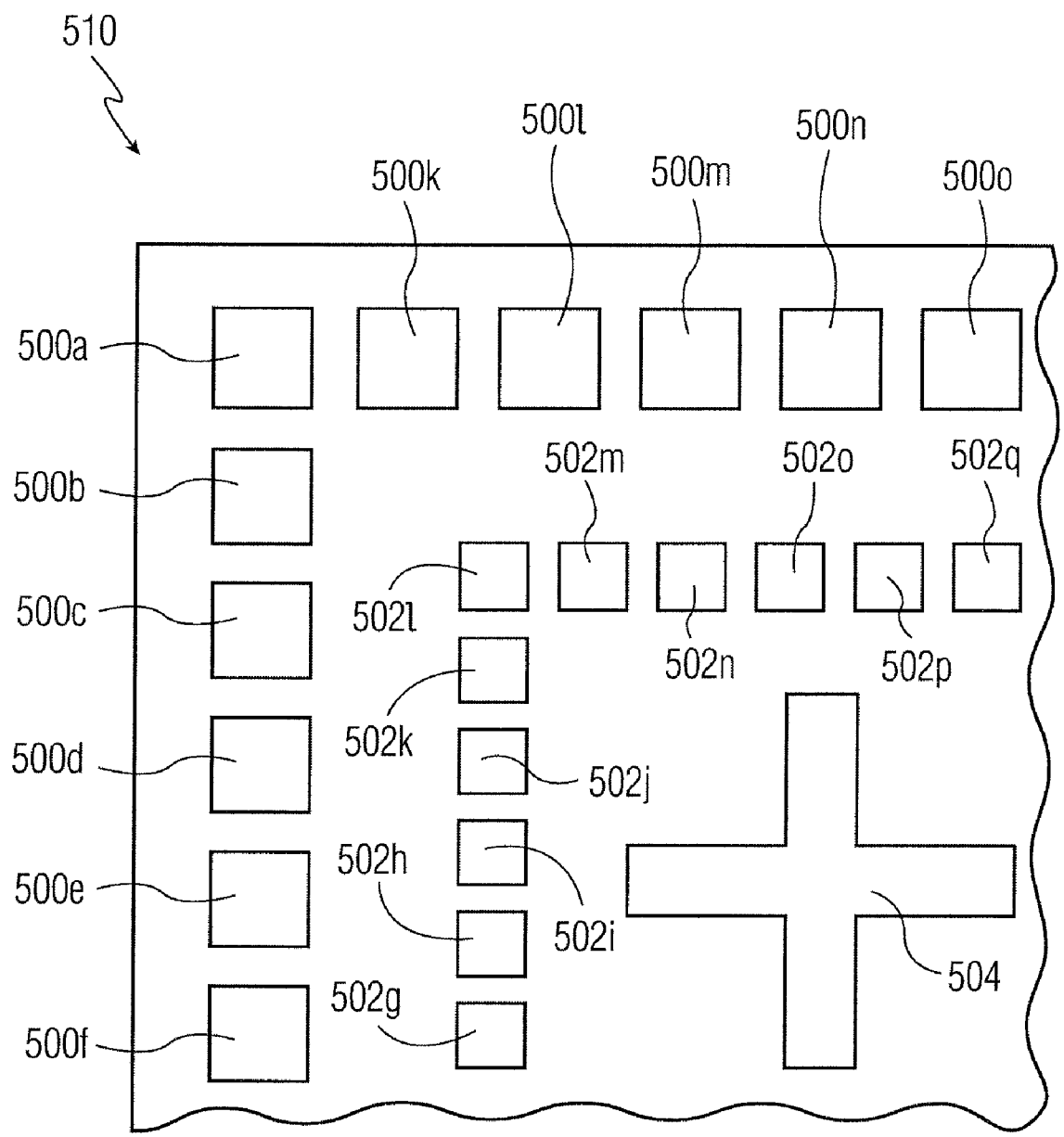
FIG. 7 is a corrected version of the eyepoint of the semiconductor device of FIG. 5 in accordance with an exemplary embodiment of the present invention.

According to certain exemplary embodiments of the present invention, known data about the semiconductor device (e.g., CAD data, a drawing, a computer scan of a drawing, a priori data, etc.) may be used to assist in defining an eyepoint. For example, such data may be used to define an eyepoint that could otherwise include certain deficiencies of the sample semiconductor device if the sample device was used to teach the eyepoint. More specifically, the known data (e.g., CAD data, a drawing, a computer scan of a drawing, a priori data, etc.) may be used to define the eyepoint as shown in FIG. 7. Note that region 510 of semiconductor device 500 as shown in FIG. 7 does not include the aberrations of bond pads 502*n* and 502*o*. By starting with the eyepoint including the shapes of region 510 illustrated in FIG. 7 (which is defined using the known data, and prior to the actual teaching of a sample device 500 on the wire bonding machine), the eyepoint 510 is initially defined without certain deficiencies. Thereafter, when the defined eyepoint 510 is actually taught on the wire bonding machine (e.g., using sample device 500 such as that shown in FIG. 6 with aberrations in pads 502*n* and 502*o*), certain deficiencies may be omitted during the teaching process because only general information of the sample device (e.g., shape and relative location of the bond pads and fiducial included in eyepoint 510) is confirmed during the teaching on the wire bonding machine. Thus, an improved eyepoint is provided by utilizing (1) known data about the semiconductor device in conjunction with (2) a sample device taught on the wire bonding machine.

Figure 8:
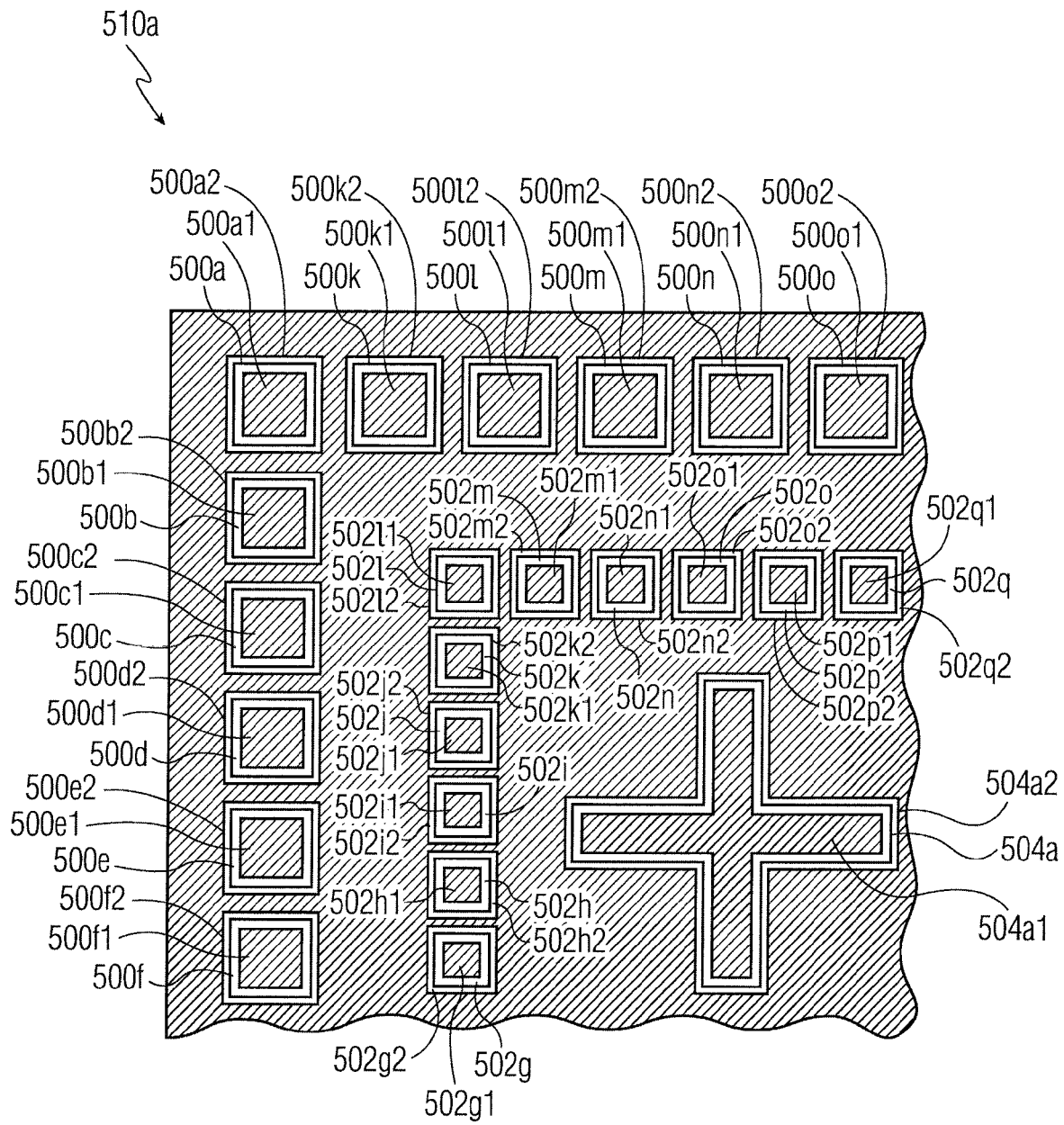
FIG. 8 is a top view of the portion of the semiconductor device of FIG. 7 with certain areas masked in accordance with an exemplary embodiment of the present invention.

FIG. 8 is an illustration of a further improved eyepoint 510*a* for semiconductor device 500. More specifically, selected regions of the portion of semiconductor device 500 are omitted from eyepoint 510*a*. These selected regions are shaded (i.e., the shaded regions may be "masked" from the eyepoint teach process) in FIG. 8. As shown in FIG. 8, an interior of each of the bond pads is shaded such that the interior is excluded from the taught eyepoint. More specifically, interior 500*a*1 of bond pad 500*a* is omitted from eyepoint 510*a*. The same is true for interior 500*b*1 of bond pad 500*b*, interior 500*c*1 of bond pad 500*c*, as well as the interior of each of bond pads 500*d*, 500*e*, 500*f*, 500*k*, 500*l*, 500*m*, 500*n*, 500*o*, 502*g*, 502*h*, 502*i*, 502*j*, 502*k*, 502*l*, 502*m*, 502*n*, 502*o*, 502*p*, and 502*q*. Likewise, interior 504*a*1 of fiducial 504 is also omitted from eyepoint 510*a*. Other shaded regions represent, for example, regions that may have inconsistent textures/reflectivities from device to device. As such, a score of a device to be wirebonded may not be affected by such shaded areas.

Further, in order to provide a small margin of error, and an area to locate the shapes, for (1) teaching the shapes/respective locations of the features of eyepoint 510*a* (e.g., the shapes and respective locations of the bond pads and fiducial of eyepoint 510*a*), and (2) later scanning of eyepoint 510*a*, a region beyond the actual bond pads (and fiducial shape) is also included in eyepoint 510*a*. More specifically, a non-shaded region 500*a*2 is provided surrounding bond pad 500*a*, and a non-shaded region 500*b*2 is provided surrounding bond pad 500*b*. Such a non-shaded region is provided (and illustrated in FIG. 8) for each of bond pads 500*c*, 500*d*, 500*e*, 500*f*, 500*k*, 500*l*, 500*m*, 500*n*, 500*o*, 502*h*, 502I, 502*j*, 502*k*, 502*l*, 502*m*, 502*n*, 502*o*, 502*p*, and 502*q*. Likewise, a non-shaded region 504*a*2 is provided surrounding fiducial 504. By providing these surrounding regions, the likelihood of teaching the exact outline of each of the bond pads and the fiducial (and their outline location with respect to each other) in an eyepoint is increased.

Figure 9:
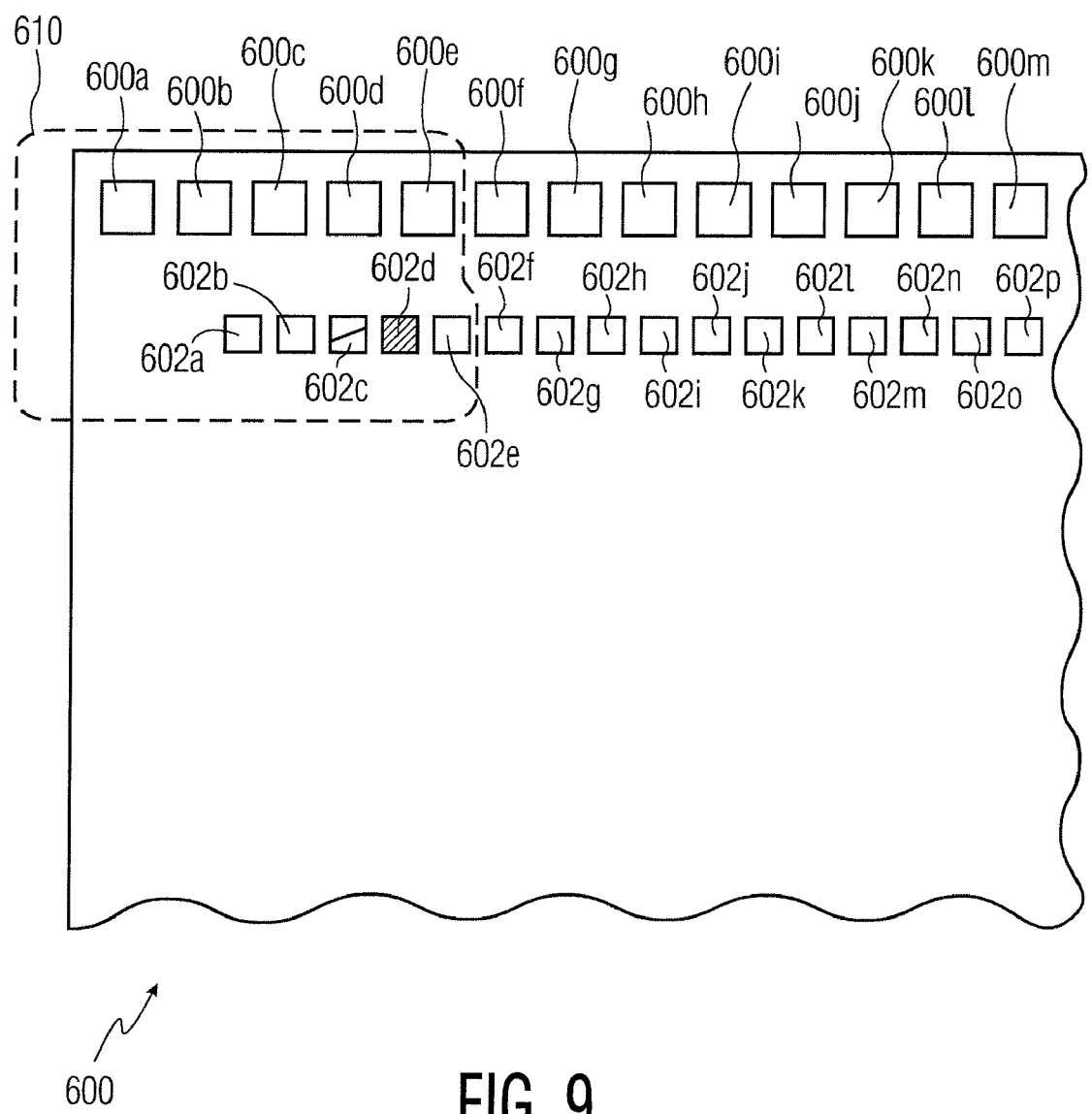
FIG. 9 is a top view of a portion of another semiconductor device including an eyepoint in accordance with an exemplary embodiment of the present invention.

FIG. 9 is a top view of a portion of semiconductor device 600 including region 610 selected to include an eyepoint in accordance with an exemplary embodiment of the present invention. Semiconductor device 600 includes a number of bond pads. As illustrated in FIG. 9, a first group of bond pads (including bond pads 600*a*, 600*b*, 600*c*, 600*d*, 600*e*, 600*f*, 600*g*, 600*h*, 600*i*, 600*j*, 600*k*, 600*l*, and 600*m*) are provided in a first row on semiconductor device 600, while a second group of bond pads (including bond pads 602*a*, 602*b*, 602*c*, 602*d*, 602*e*, 602*f*, 602*g*, 602*h*, 602*i*, 602*j*, 602*k*, 602*l*, 602*m*, 602*n*, 602*o*, and 602*p*) are provided in a second row.

Figure 10:
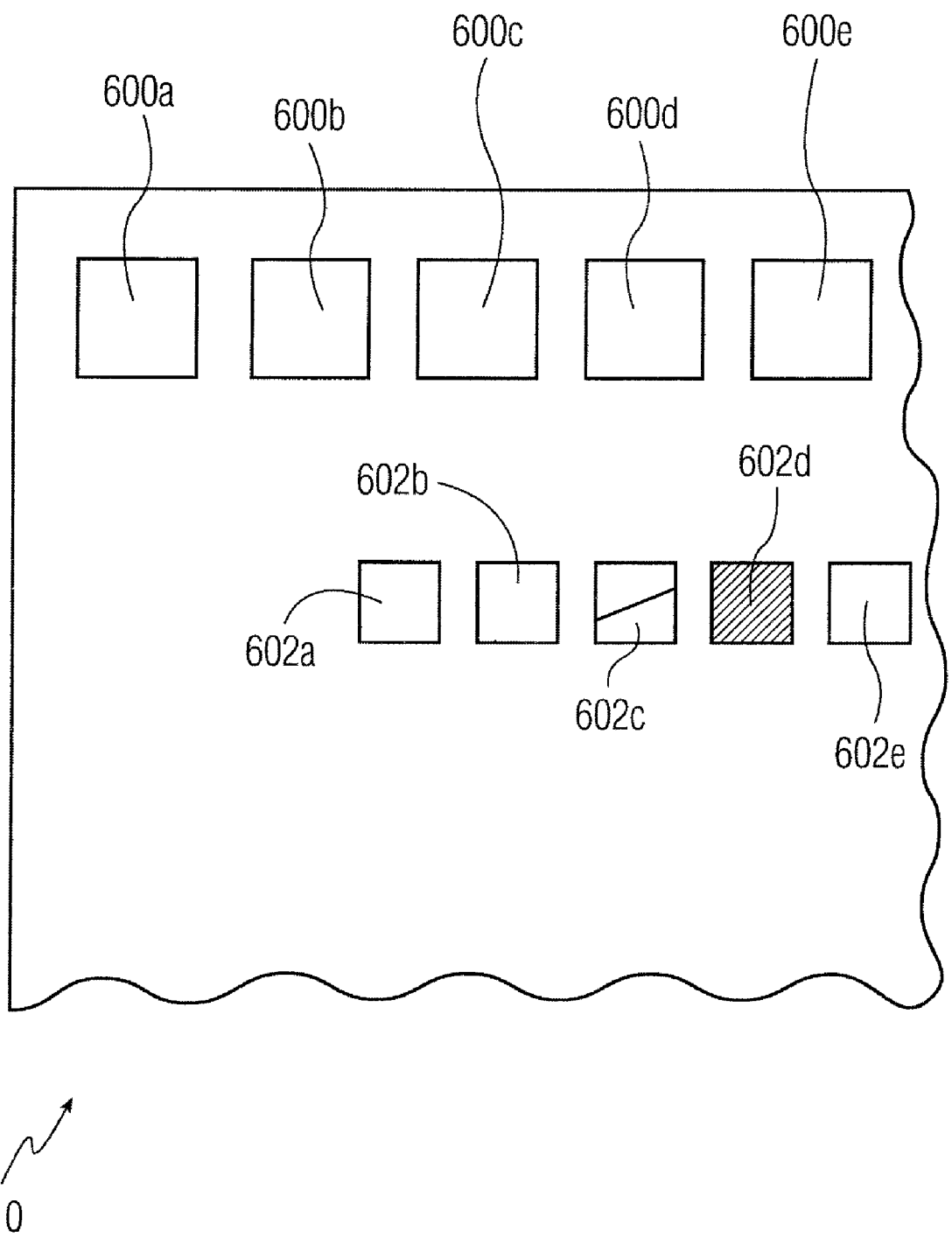
FIG. 10 is a top view of a portion of the semiconductor device of FIG. 9 selected as an eyepoint in accordance with an exemplary embodiment of the present invention.

FIG. 10 is a detailed view of region 610 of semiconductor device 600 selected to include an eyepoint of semiconductor device 600. Region 610 includes bond pads 600*a*, 600*b*, 600*c*, 600*d*, 600*e*, 602*a*, 602*b*, 602*c*, 602*d*, and 602*e*. Note that bond pads 602*c* and 602*d* include some type of aberration that may be visible to a vision system performing a scan of the bond pad (e.g., a blemish, varying reflectivity, a visible flaw, etc.). If semiconductor device 600 (including the aberrations of bond pads 602*c* and 602*d*) is used to teach an eyepoint to a wire bonding machine, when it is time to process (e.g., wire bond) an actual semiconductor device using the eyepoint taught from semiconductor device 600, a number of potential problems may result (e.g., the score for semiconductor device to be processed being below a threshold value even though the device is acceptable for further processing, an undesirably low MTBA for devices such as semiconductor device 600, etc.).

Figure 11:
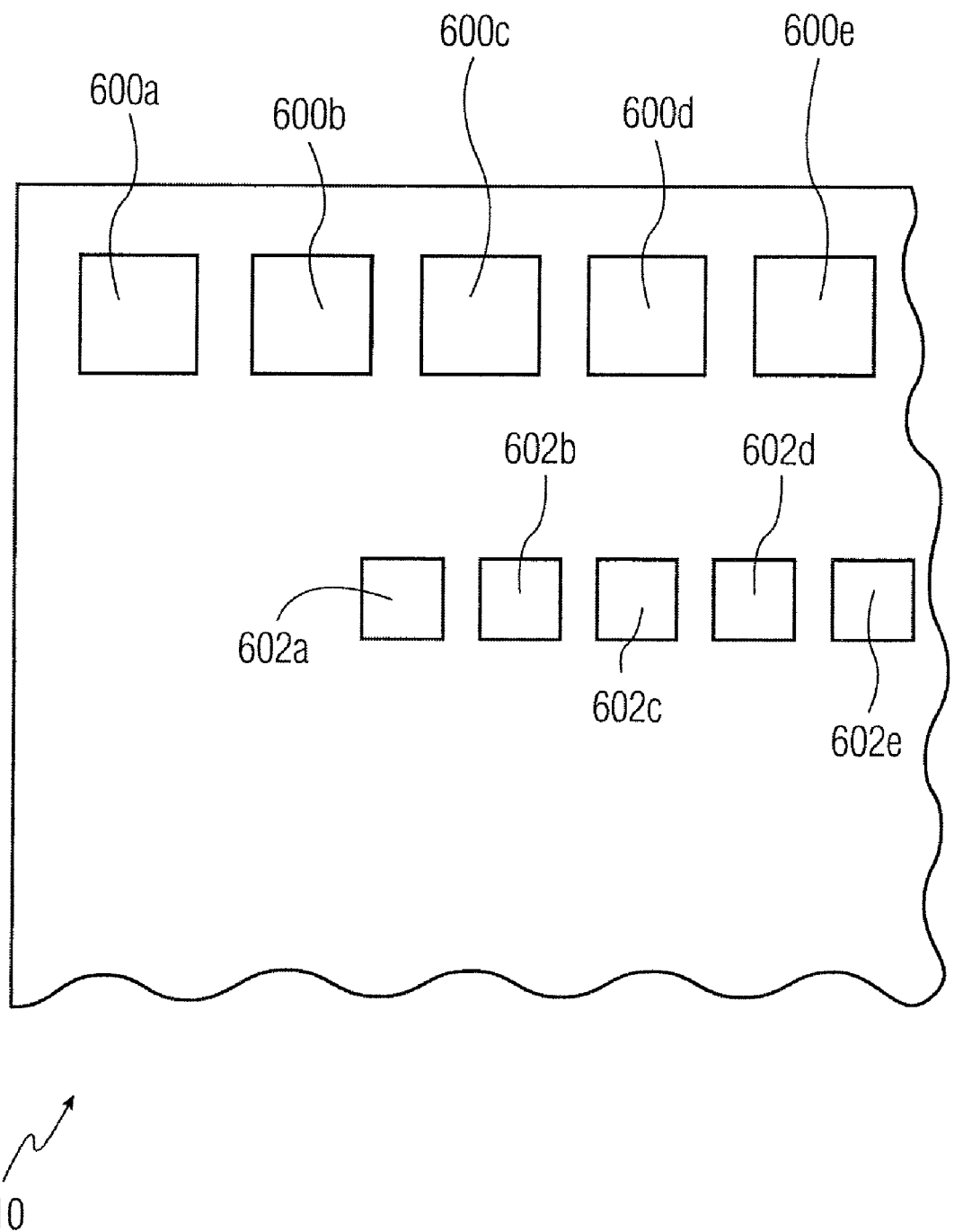
FIG. 11 is a corrected version of the eyepoint of the semiconductor device of FIG. 9 in accordance with an exemplary embodiment of the present invention.

According to certain exemplary embodiments of the present invention, known data about the semiconductor device (e.g., CAD data, a drawing, a computer scan of a drawing, a priori data, etc.) may be used to assist in defining an eyepoint. For example, such data may be used to correct an eyepoint that could include certain deficiencies of the sample semiconductor device used to teach the eyepoint. More specifically, the known data (e.g., CAD data, a drawing, a computer scan of a drawing, a priori data, etc.) may be used to define the eyepoint as shown in FIG. 11. Note that region 610 of semiconductor device 600 as shown in FIG. 11 does not include the aberrations of bond pads 602c and 602d. By starting with the eyepoint 610 illustrated in FIG. 11 (which is defined using the known data, and prior to the actual teaching of a sample device 600 on the wire bonding machine), the eyepoint 610 is initially defined without certain deficiencies. Thereafter, when the defined eyepoint 610 is actually taught on the wire bonding machine (e.g., using sample device 600 such as that shown in FIG. 10 with aberrations at bond pads 602c and 602d), certain deficiencies may be omitted during the teaching process because only general information of the sample device (e.g., shape and relative location of the bond pads included in eyepoint 610) is confirmed during the teaching on the wire bonding machine. Thus, an improved eyepoint is provided by utilizing (1) known data about the semiconductor device in conjunction with (2) a sample device taught on the wire bonding machine.

Figure 12:
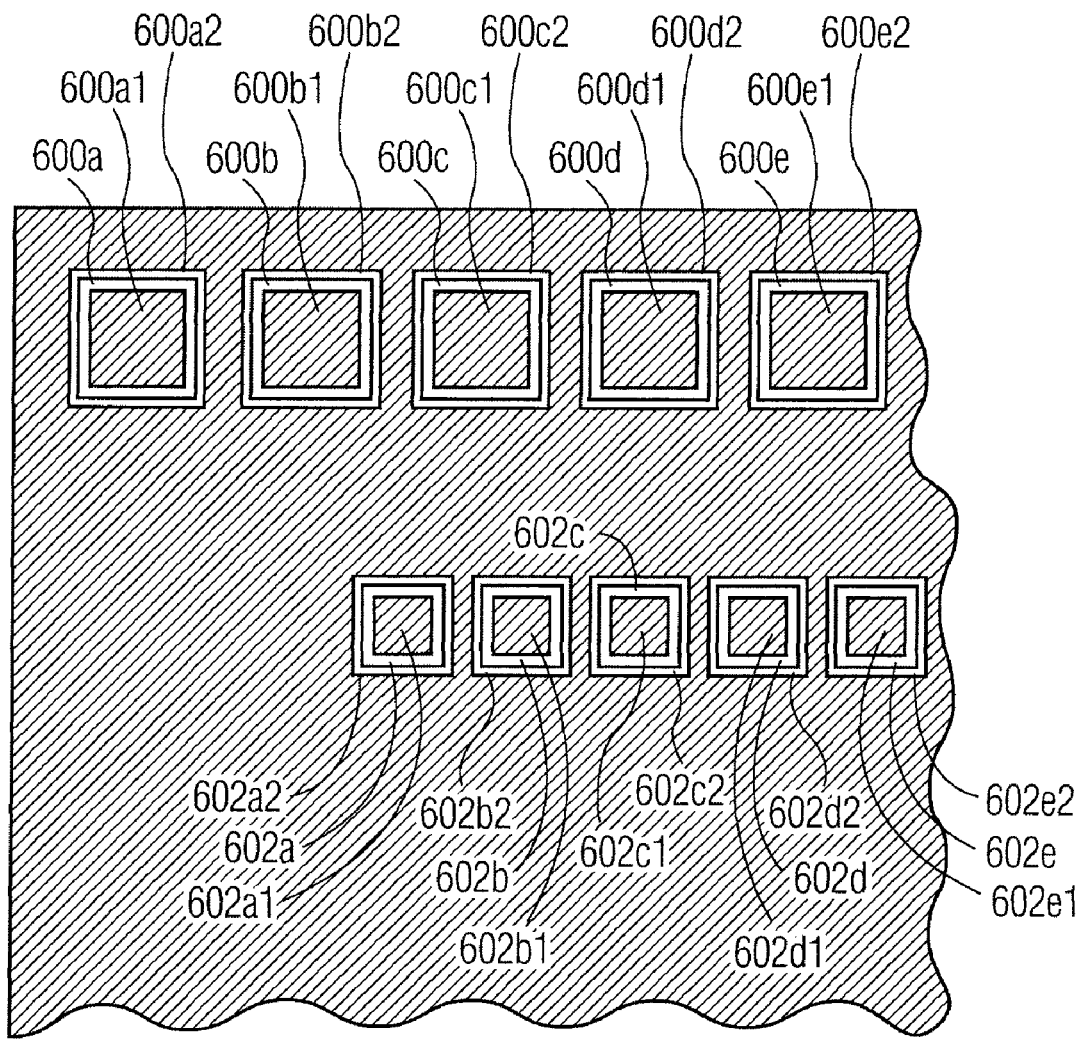
FIG. 12 is a top view of the portion of the semiconductor device of FIG. 11 with certain areas masked in accordance with an exemplary embodiment of the present invention.

FIG. 12 is an illustration of a further improved eyepoint 610a for semiconductor device 600. More specifically, selected regions of the portion of semiconductor device 600 are omitted from eyepoint 610a. These selected regions are shaded (i.e., the shaded regions may be "masked" from the eyepoint teach process) in FIG. 12. As shown in FIG. 12, an interior of each of the bond pads is shaded such that the interior is excluded from the taught eyepoint. More specifically, interior 600a1 of bond pad 600a is omitted from eyepoint 610a. The same is true for interior 600b1 of bond pad 600b, interior 600c1 of bond pad 600c, as well as the interior of each of bond pads 600d, 600e, 602a, 602b, 602c, 602d, and 602e.

Further, in order to provide a small margin of error, and an area to locate the shapes, for (1) teaching the shapes/respective locations of the features of eyepoint 610a (e.g., the shapes and respective locations of the bond pads eyepoint 610a), and (2) later scanning of eyepoint 610a, a region beyond the actual bond pads is also included in eyepoint 610a. More specifically, a non-shaded region 600a2 is provided surrounding bond pad 600a, and a non-shaded region 600b2 is provided surrounding bond pad 600b. Such a non-shaded region is provided (and illustrated in FIG. 12) for each of bond pads 600c, 600d, 600e, 602a, 602b, 602c, 602d, and 602e. By providing these surrounding regions, the likelihood of teaching the exact outline of each of the bond pads in an eyepoint (and their outline location with respect to each other) is increased.

Figure 13:
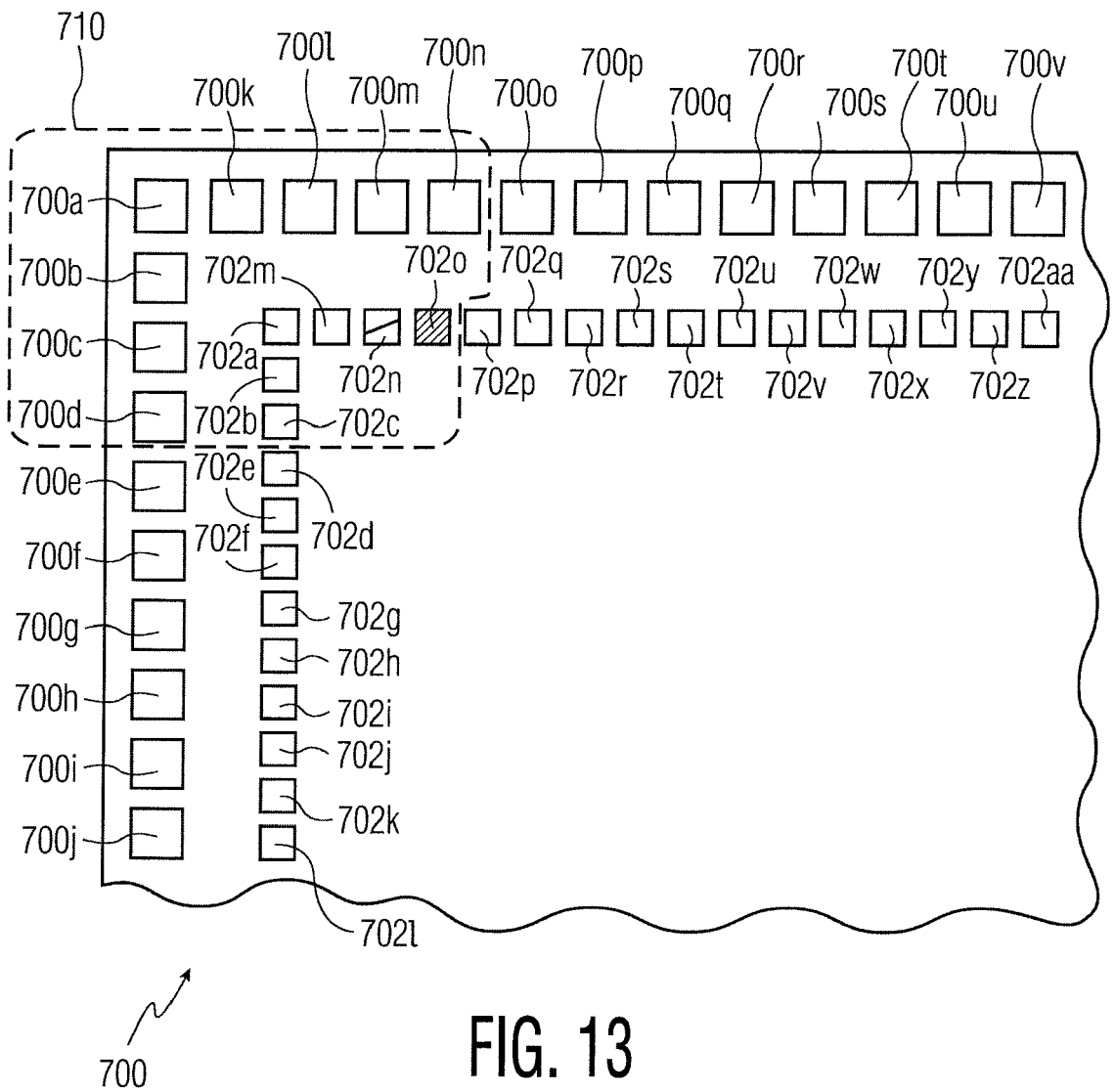
FIG. 13 is a top view of a portion of another semiconductor device including an eyepoint in accordance with an exemplary embodiment of the present invention.

FIG. 13 is a top view of a portion of semiconductor device 700 including region 710 selected to include an eyepoint in accordance with an exemplary embodiment of the present invention. Semiconductor device 700 includes a number of bond pads. As illustrated in FIG. 13, a first group of bond pads (including bond pads 700a, 700b, 700c, 700d, 700e, 700f, 700g, 700h, 700i, 700j, 700k, 700l, 700m, 700n, 700o, 700p, 700q, 700r, 700s, 700t, 700u, and 700v) are provided about a periphery of semiconductor device 700, while a second group of bond pads (including bond pads 702a, 702b, 702c, 702d, 702e, 702f, 702g, 702h, 702i, 702j, 702k, 702l, 702m, 702n, 702o, 702p, 702q, 702r, 702s, 702t, 702u, 702v, 702w, 702x, 702y, 702z, and 702aa) are provided inside the first group.

Figure 14:
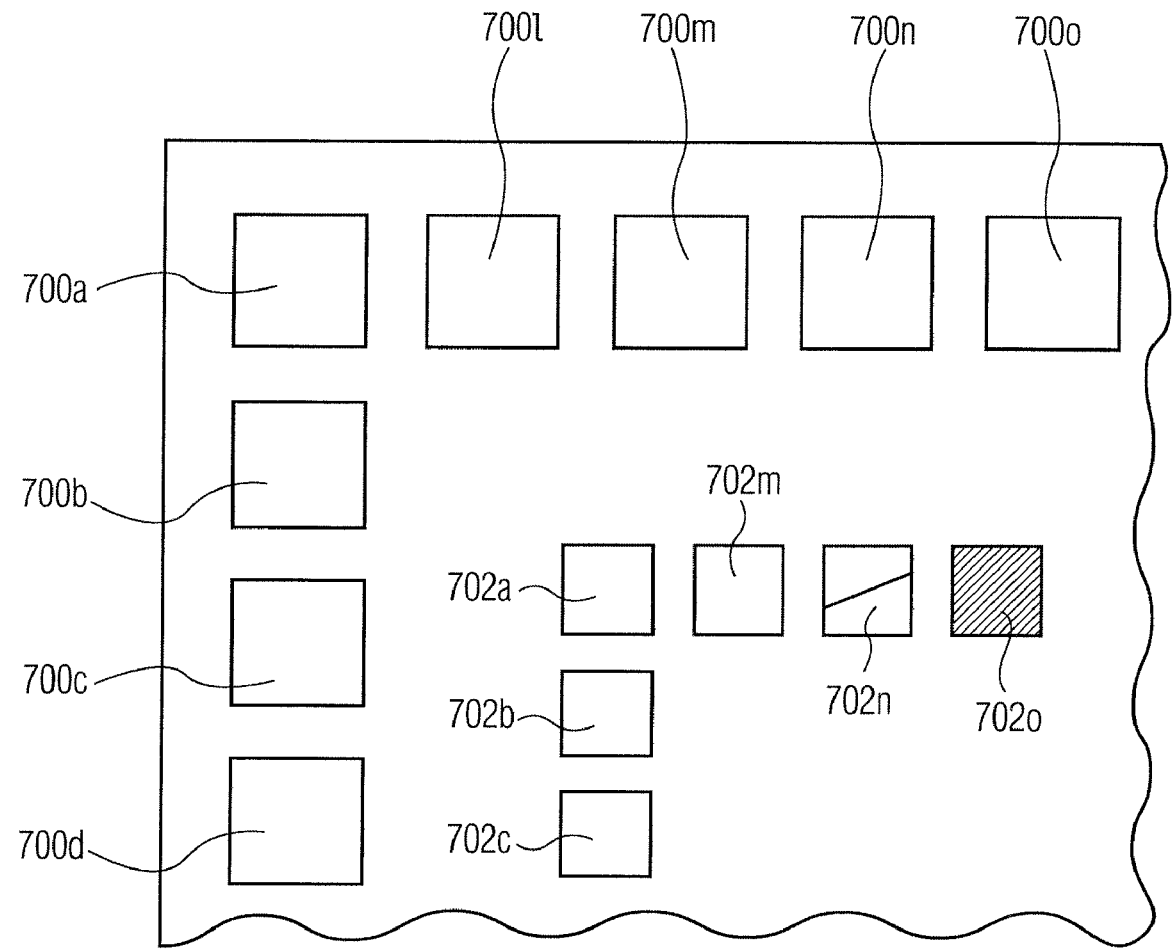
FIG. 14 is a top view of a portion of the semiconductor device of FIG. 13 selected as an eyepoint in accordance with an exemplary embodiment of the present invention.

FIG. 14 is a detailed view of region 710 of semiconductor device 700 selected to include an eyepoint of semiconductor device 700. Region 710 includes bond pads 700a, 700b, 700c, 700d, 7001, 700m, 700n, 700o, 702a, 702b, 702c, 702m, 702n, and 702o. Note that bond pads 702n and 702o include some type of aberration that may be visible to a vision system performing a scan of the bond pad (e.g., a blemish, varying reflectivity, a visible flaw, etc.). If semiconductor device 700 (including the aberrations of bond pads 702n and 702o) is used to teach an eyepoint to a wire bonding machine, when it is time to process (e.g., wire bond) an actual semiconductor device using the eyepoint taught from semiconductor device 700, a number of potential problems may result (e.g., the score for semiconductor device to be processed being below a threshold value even though the device is acceptable for further processing, an undesirably low MTBA for devices such as semiconductor device 700, etc.).

Figure 15:
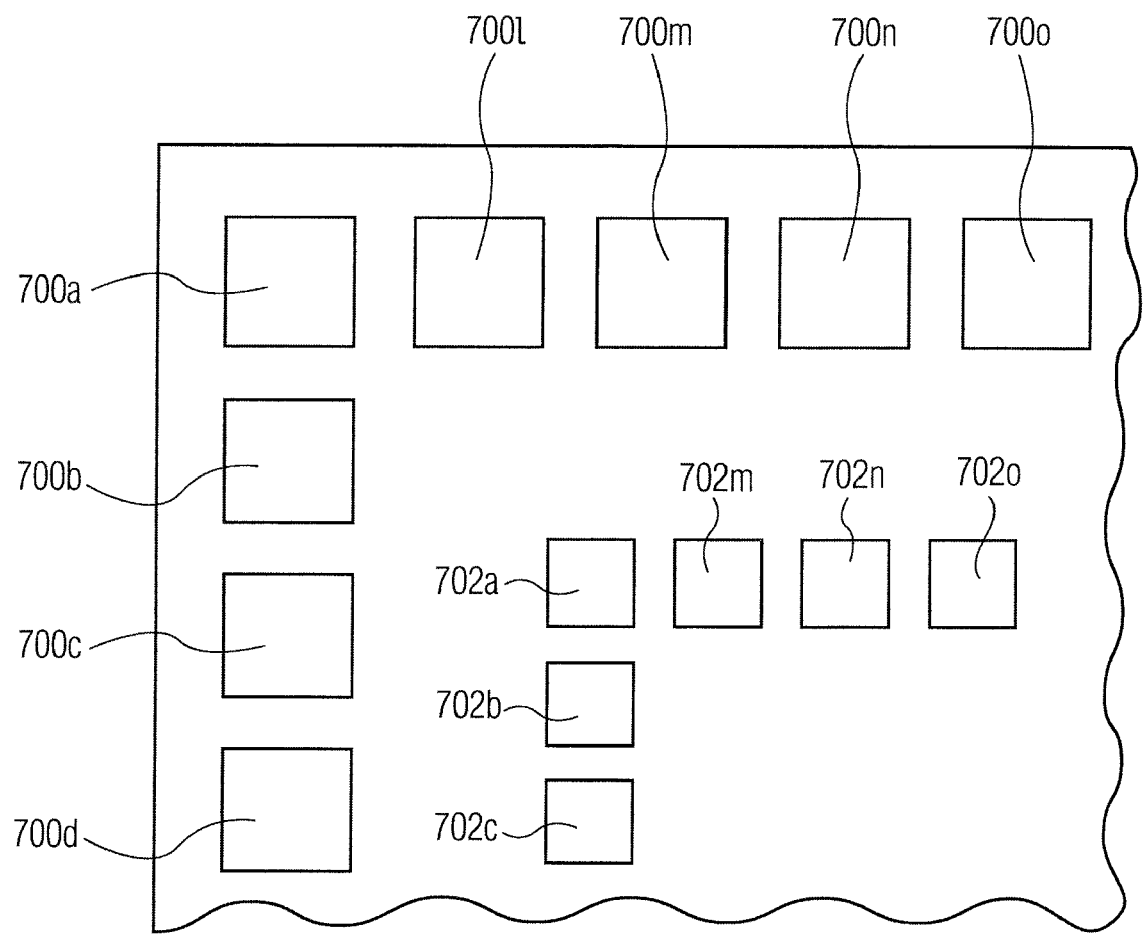
FIG. 15 is a corrected version of the eyepoint of the semiconductor device of FIG. 13 in accordance with an exemplary embodiment of the present invention.

According to certain exemplary embodiments of the present invention, known data about the semiconductor device (e.g., CAD data, a drawing, a computer scan of a drawing, a priori data, etc.) may be used to assist in defining an eyepoint. For example, such data may be used to correct an eyepoint that could include certain deficiencies of the sample semiconductor device used to teach the eyepoint. More specifically, the known data (e.g., CAD data, a drawing, a computer scan of a drawing, a priori data, etc.) may be used to define the eyepoint as shown in FIG. 15. Note that region 710 of semiconductor device 700 as shown in FIG. 15 does not include does not include the aberrations of bond pads 702n and 702o. By starting with the eyepoint 710 illustrated in FIG. 15 (which is defined using the known data, and prior to the actual teaching of a sample device 700 on the wire bonding machine), the eyepoint 710 is initially defined without certain deficiencies. Thereafter, when the defined eyepoint 710 is actually taught on the wire bonding machine (e.g., using sample device 700 such as that shown in FIG. 13 with aberrations at bond pads 702n and 702o), certain deficiencies may be omitted during the teaching process because only general information of the sample device (e.g., shape and relative location of the bond pads included in eyepoint 710) is confirmed during the teaching on the wire bonding machine. Thus, an improved eyepoint is provided by utilizing (1) known data about the semiconductor device in conjunction with (2) a sample device taught on the wire bonding machine.

Figure 16:
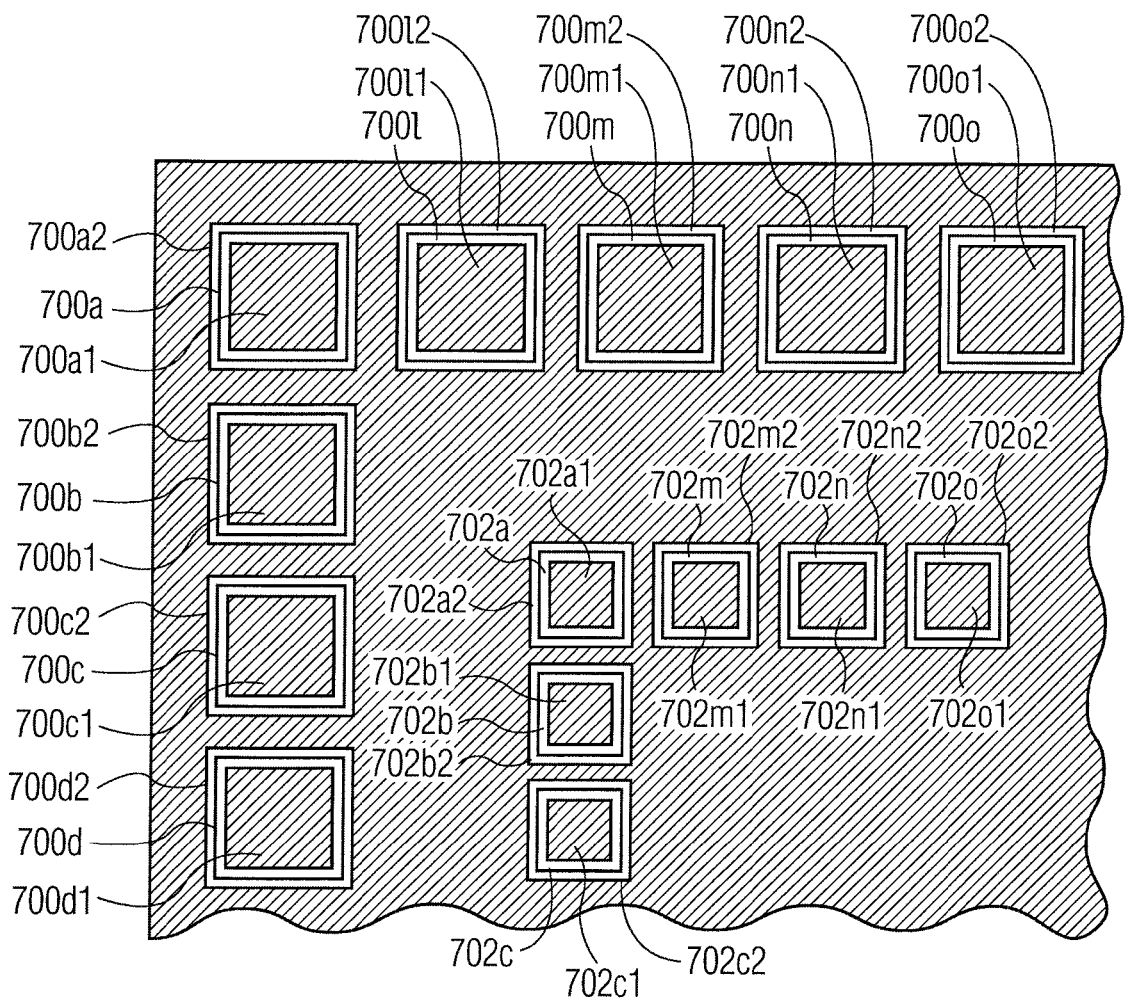
FIG. 16 is a top view of the portion of the semiconductor device of FIG. 15 with certain areas masked in accordance with an exemplary embodiment of the present invention.

FIG. 16 is an illustration of a further improved eyepoint 710a for semiconductor device 700. More specifically, selected regions of the portion of semiconductor device 700 are omitted from eyepoint 710a. These selected regions are shaded (i.e., the shaded regions may be "masked" from the eyepoint teach process) in FIG. 16. As shown in FIG. 16, an interior of each of the bond pads is shaded such that the interior is excluded from the taught eyepoint. More specifically, interior 700a1 of bond pad 700a is omitted from eyepoint 710a. The same is true for interior 700b1 of bond pad 700b, interior 700c1 of bond pad 700c, as well as the interior of each of bond pads 700d, 700l, 700m, 700n, 700o, 702a, 702b, 702c, 702m, 702n, and 702o.

Further, in order to provide a small margin of error, and an area to locate the shapes, for (1) teaching the shapes/respective locations of the features of eyepoint 710a (e.g., the shapes and respective locations of the bond pads eyepoint 710*a*), and (2) later scanning of eyepoint 710*a*, a region beyond the actual bond pads is also included in eyepoint 710*a*. More specifically, a non-shaded region 700*a*2 is provided surrounding bond pad 700*a*, and a non-shaded region 700*b*2 is provided surrounding bond pad 700*b*. Such a non-shaded region is provided (and illustrated in FIG. 16) for each of bond pads 700*c*, 700*d*, 700*l*, 700*m*, 700*n*, 700*o*, 702*a*, 702*b*, 702*c*, 702*m*, 702*n*, and 702*o*. By providing these surrounding regions, the likelihood of teaching the exact outline of each of the bond pads in an eyepoint (and their outline location with respect to each other) is increased.

Figure 17:
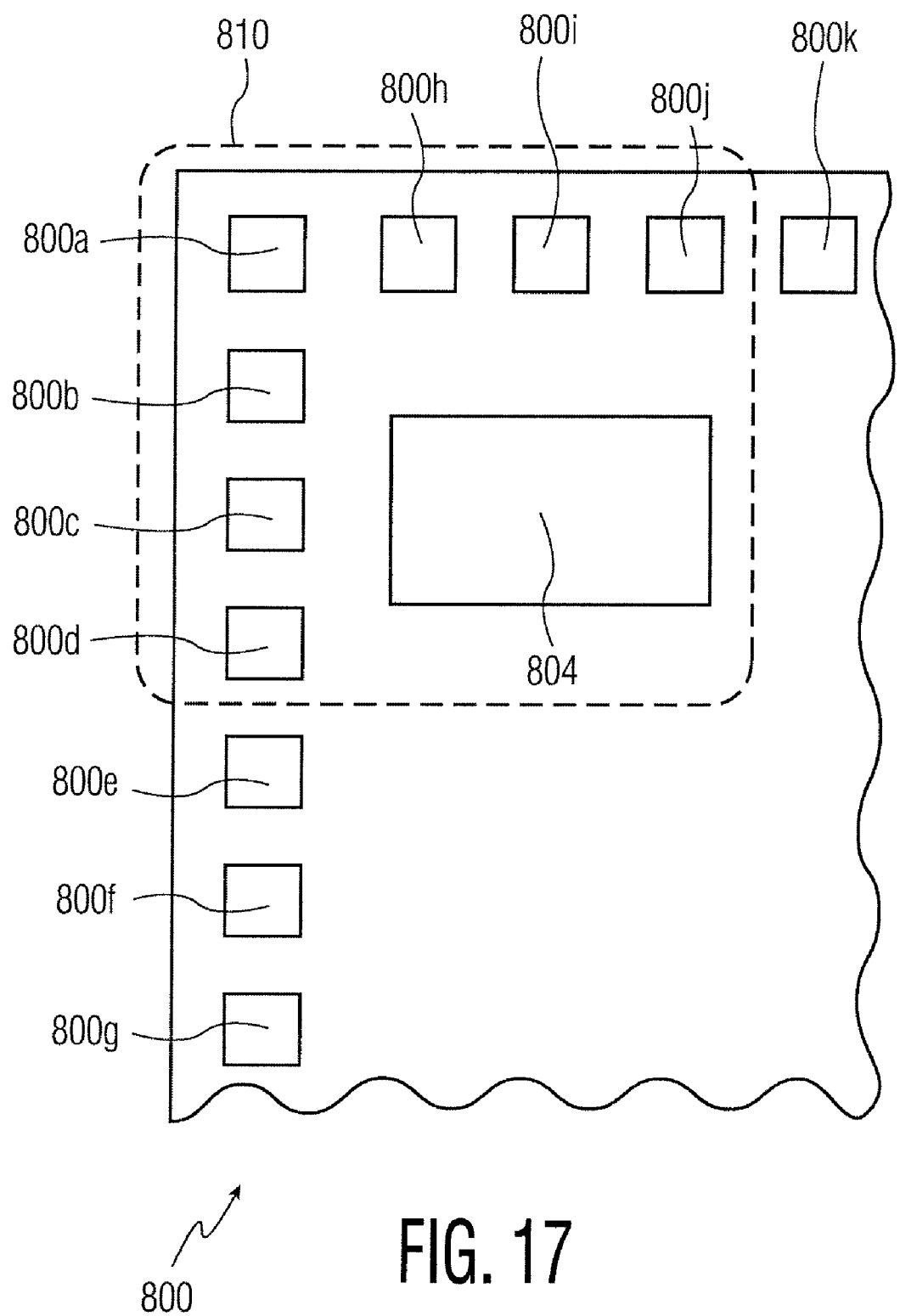
FIG. 17 is a top view of a portion of another semiconductor device including an eyepoint in accordance with an exemplary embodiment of the present invention.

FIG. 17 is a top view of a portion of semiconductor device 800 including region 810 selected to include an eyepoint in accordance with an exemplary embodiment of the present invention. Semiconductor device 800 includes a number of bond pads. As illustrated in FIG. 17, semiconductor device includes bond pads 800*a*, 800*b*, 800*c*, 800*d*, 800*e*, 800*f*, 800*g*, 800*h*, 800*i*, 800*j*, and 800*k*. Semiconductor device 800 also includes circuit element 804.

As outlined in FIG. 17, region 810 of semiconductor device 800 includes bond pads 800*a*, 800*b*, 800*c*, 800*d*, 800*h*, 800*i*, and 800*j*, as well as circuit element 804. Thus, it is clear that shapes (and respective locations) of portions of semiconductor devices other than bond pads and fiducials (such as circuit element 804 which may be a wiring pattern, a conductive trace pattern, and/or the like) are also contemplated for use as part of an eyepoint.

Figure 18:
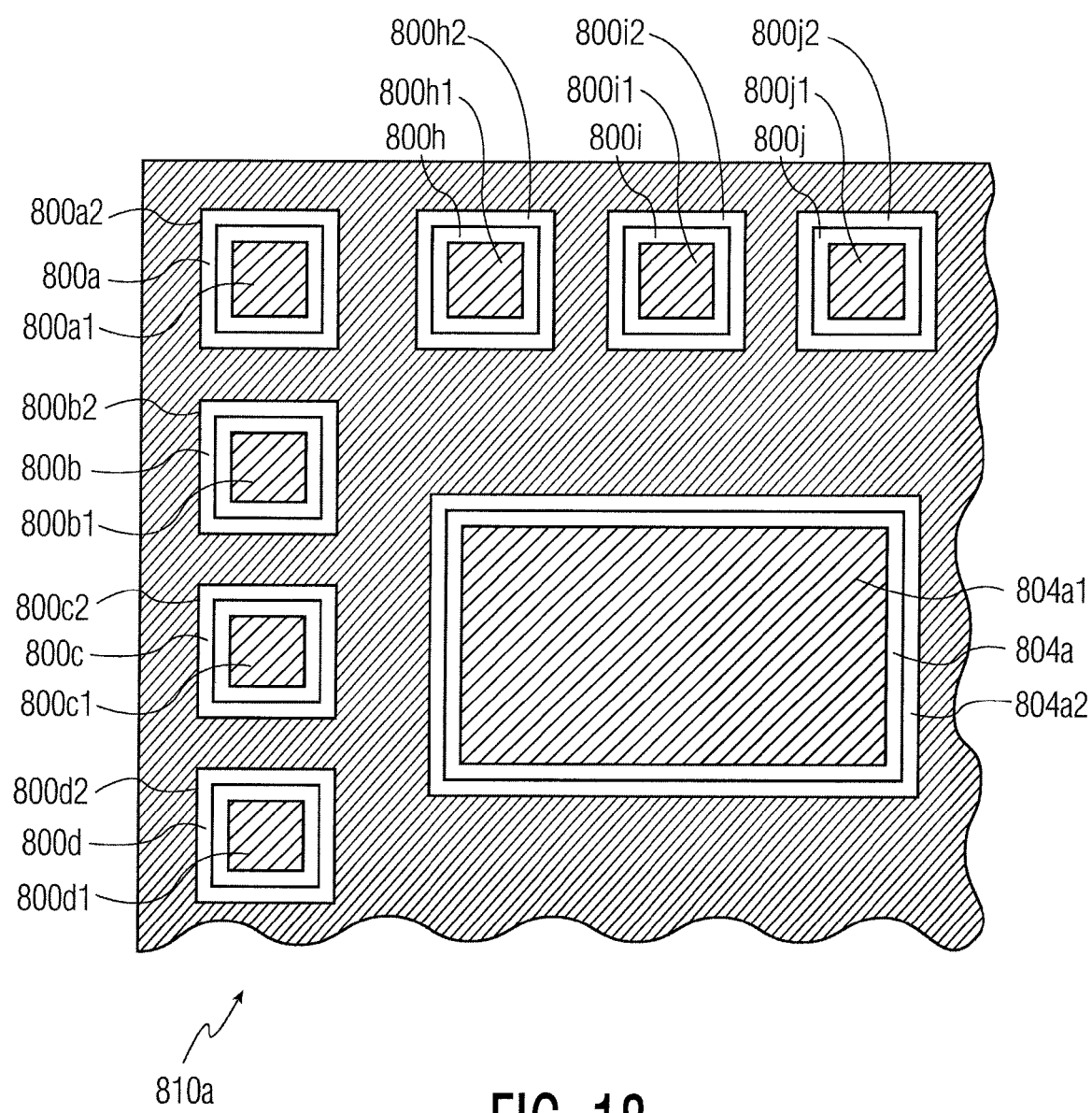
FIG. 18 is a top view of the eyepoint portion of the semiconductor device of FIG. 17 with certain areas masked in accordance with an exemplary embodiment of the present invention.

FIG. 18 is an illustration of a further improved eyepoint 810*a* for semiconductor device 800. More specifically, selected regions of the portion of semiconductor device 800 are omitted from eyepoint 810*a*. These selected regions are shaded (i.e., the shaded regions may be "masked" from the eyepoint teach process) in FIG. 18. As shown in FIG. 18, an interior of each of the bond pads is shaded such that the interior is excluded from the taught eyepoint. More specifically, interior 800*a*1 of bond pad 800*a* is omitted from eyepoint 810*a*. The same is true for interior 800*b*1 of bond pad 800*b*, interior 800*c*1 of bond pad 800*c*, as well as the interior of each of bond pads 800*d*, 800*h*, 800*i*, and 800*j*, as well as interior portion 804*a*1 of circuit element 804*a*.

Further, in order to provide a small margin of error, and an area to locate the shapes, for (1) teaching the shapes/respective locations of the features of eyepoint 810*a* (e.g., the shapes and respective locations of the bond pads, as well as circuit element 804, of eyepoint 810*a*), and (2) later scanning of eyepoint 810*a*, a region beyond the actual bond pads, as well as beyond circuit element 804, is also included in eyepoint 810*a*. More specifically, a non-shaded region 800*a*2 is provided surrounding bond pad 800*a*, and a non-shaded region 800*b*2 is provided surrounding bond pad 800*b*. Such a non-shaded region is also provided (and illustrated in FIG. 18) for each of bond pads 800*c*, 800*d*, 800*h*, 800*i*, and 800*j*, as well as for circuit element 804. By providing these surrounding regions, the likelihood of teaching the exact outline of each of the bond pads (and an outline of circuit element 804) in an eyepoint (and their outline location with respect to each other) is increased.

Figure 19:
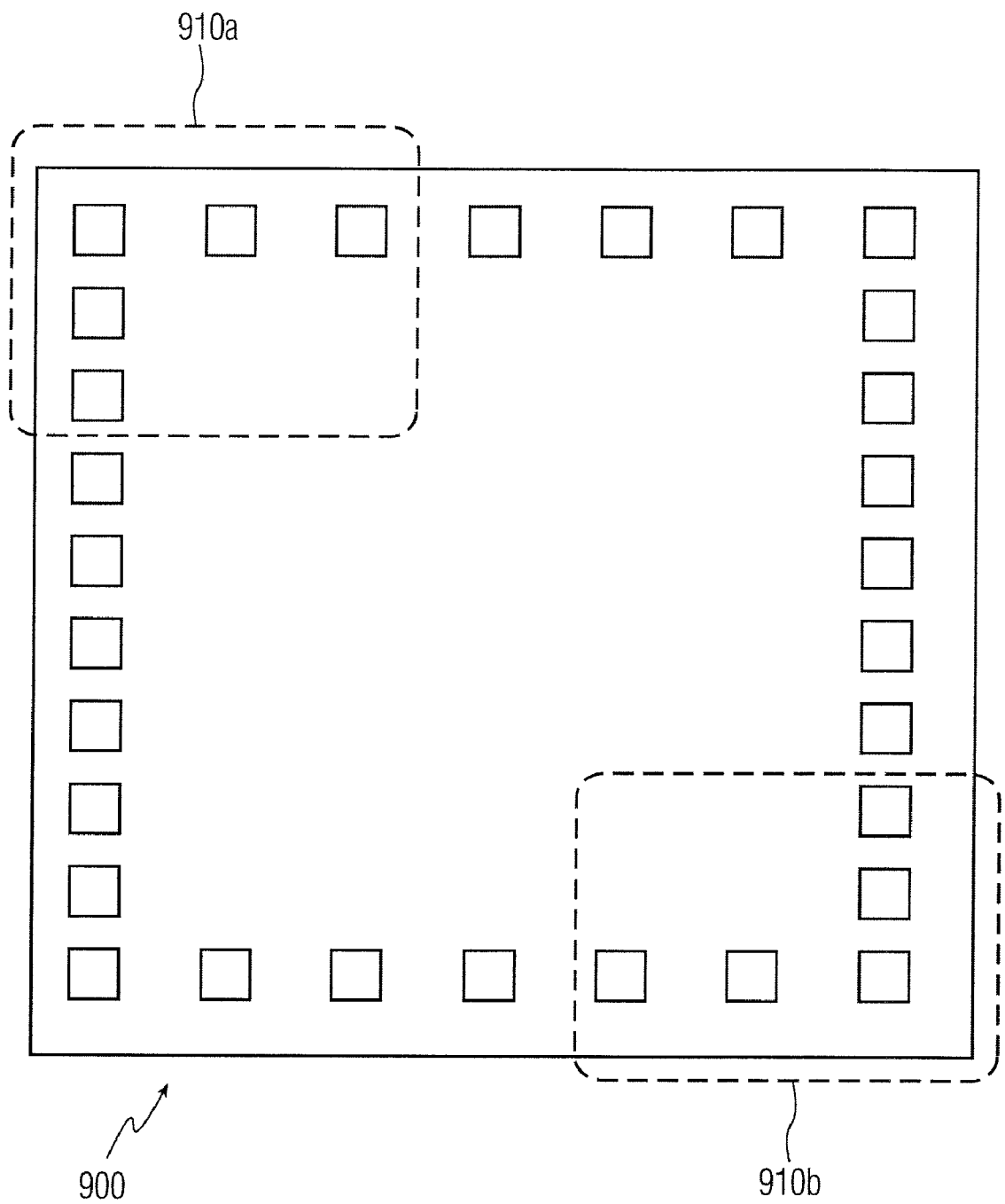
FIG. 19 is a top view of a semiconductor device including two eyepoints in accordance with an exemplary embodiment of the present invention.

FIG. 19 is a top view of semiconductor device 900. As shown in FIG. 19, two distinct eyepoints (i.e., eyepoint 910*a* and eyepoint 910*b*) have been defined. Thus, it is clear that the teachings of the present invention disclosed herein, through its various exemplary embodiments, are applicable to wire bonding operations utilizing multiple eyepoints.

Figure 20:
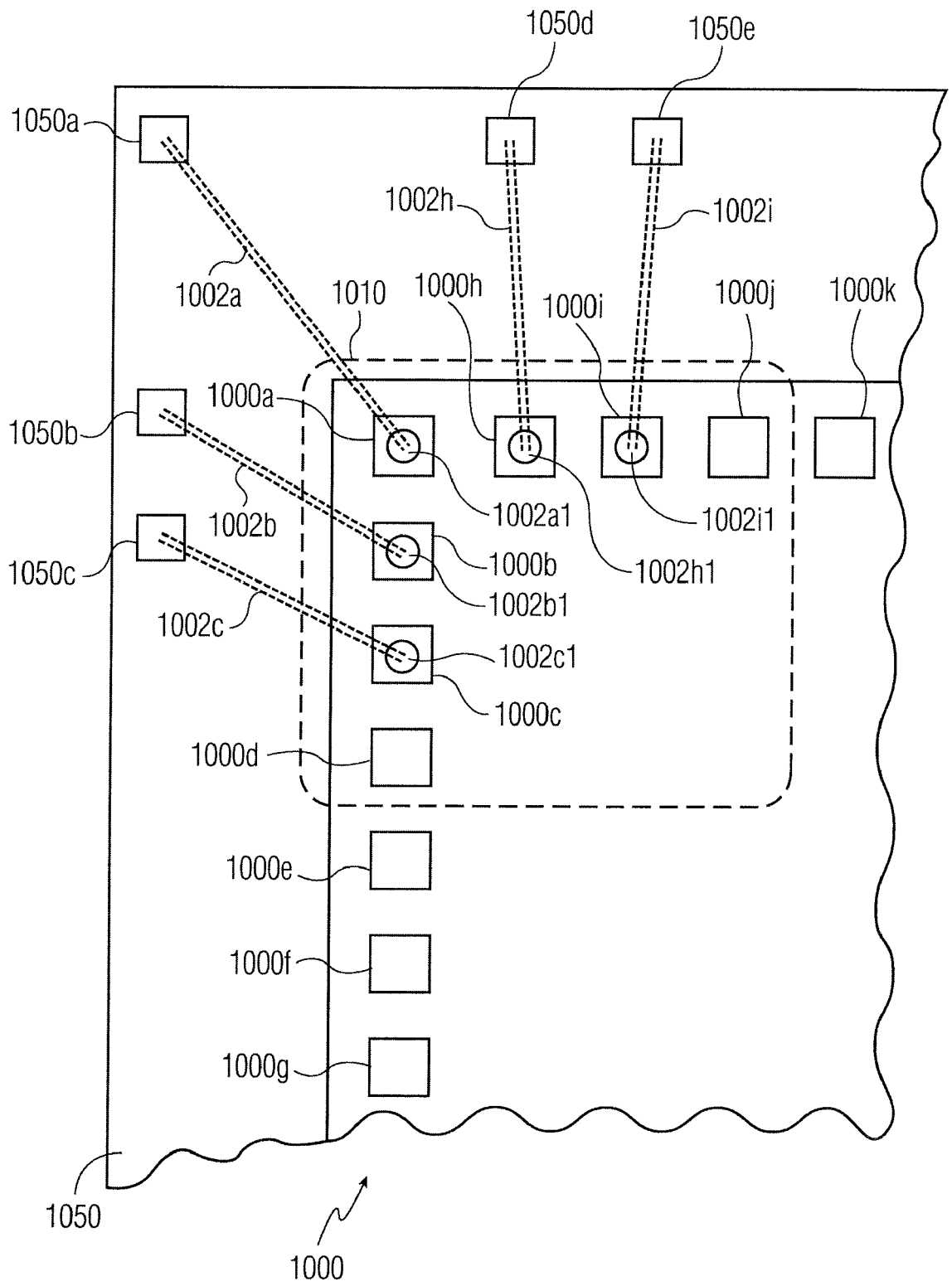
FIG. 20 is a top view of a portion of semiconductor device bonded to a leadframe in accordance with an exemplary embodiment of the present invention.

While various of the figures provided herein illustrate a semiconductor die alone, it is understood that during processing steps such as wire bonding, the semiconductor die has typically been bonded (e.g., die-bonded using an adhesive or the like) to a support structure such as a leadframe or a substrate. FIG. 20 is a top view of a portion of semiconductor device 1000 (e.g., a semiconductor die 1000) bonded to leadframe 1050.

Semiconductor device 1000 includes bond pads 1000*a*, 1000*b*, 1000*c*, 1000*d*, 1000*e*, 1000*f*, 1000*g*, 1000*h*, 1000*l*, 1000*j*, and 1000*k*. Eyepoint 1010 is selected to include bond pads 1000*a*, 1000*b*, 1000*c*, 1000*d*, 1000*h*, 1000*i*, and 1000*j*. Leadframe 1050 includes a plurality of "leads" including leads 1050*a*, 1050*b*, 1050*c*, 1050*d*, and 1050*e*. During processing of semiconductor devices (e.g., wire bonding) it sometimes happens that a device that has already been wire bonded is put on the wire bonding machine. For example, this may be an error. Alternatively, it may be that a portion of the device has been wire bonded, but that another portion of the device still needs to be wirebonded. It is very desirable to know if a device on a wire bonding machine has been wire bonded or not. For example, if this is not known, a device that has already been wire bonded may be subjected to further unintended wire bonding in which case the device may be destroyed or otherwise rendered worthless.

According to an exemplary embodiment of the present invention, a method of determining if a device has been wire bonded is provided. As shown in FIG. 20 a number of wire loops 1002*a*, 1002*b*, 1002*c*, 1002*h*, and 1002*i* are illustrated. More specifically, wire loop 1002*a* (including ball bond 1002*a*1 bonded to bond pad 1000*a*) provides electrical interconnection between bond pad 1000*a* and lead 1050*a*; wire loop 1002*b* (including ball bond 1002*b*1 bonded to bond pad 1000*b*) provides electrical interconnection between bond pad 1000*b* and lead 1050*b*; wire loop 1002*c* (including ball bond 1002*c*1 bonded to bond pad 1000*c*) provides electrical interconnection between bond pad 1000*c* and lead 1050*c*; wire loop 1002*h* (including ball bond 1002*h*1 bonded to bond pad 1000*h*) provides electrical interconnection between bond pad 1000*h* and lead 1050*d*; and wire loop 1002*i* (including ball bond 1002*i*1 bonded to bond pad 1000*i*) provides electrical interconnection between bond pad 1000*i* and lead 1050*e*. Using a pattern recognition method and/or system such as those described above with respect to teaching shapes and relative locations of shapes (e.g., bond pad shapes and relative locations of bond pad shapes), a shape of a portion of a wire loop may be recognized. More specifically, an algorithm may be configured to search the bond pads of a semiconductor die to determine if a wire has been bonded thereto. In the example illustrated in FIG. 20, the algorithm may be configured to search for the shape of a ball bond (e.g., a circle, an ellipse, etc.) on a bond pad to see if a wire has been bonded thereto.

Further features of this aspect of the present invention may also be provided. For example, the eyepoint (e.g., eyepoint 1010 illustrated in FIG. 20) may be selected to include the bond pads that will be wire bonded first during the wire bonding process. With respect to FIG. 20, bond pad 1000*a* may be the first bond pad to be wirebonded. Thus, eyepoint 1010 is selected to include this bond pad. As such, during the process of using pattern recognition to see if a wire has been bonded to a bond pad (e.g., by looking for a shape of a ball bond on the bond pad), the likelihood of seeing a bonded wire (e.g., wire loop 1002*a*) is greater because the selected eyepoint includes the first pad that would have been wire bonded.

Further, a method of determining if a wire has been bonded to a pad of the semiconductor device may be integrated into a process of teaching an eyepoint. For example, in a first step a teaching process for teaching an eyepoint according to the present invention may be carried out. In a second step, a distinct teaching process for teaching a second eyepoint (the eyepoint for checking for bonded wires) may be taught. Subsequently, when a device to be wirebonded is on the machine, confirmation of the position and/or alignment of the device could be done using the first taught eyepoint. Then, once the position and/or alignment of the device has been confirmed, a second scan may be completed to see if there were any bonded wires. In such an embodiment, the first eyepoint may have the interior of the bond pads masked (as in FIGS. 4, 8, 12, 16, and 18) while the second eyepoint does not have the interior of the bond pads masked (such that the interior of the bond pads may be scanned for ball bond shapes).

In another alternative embodiment, a single eyepoint may be taught, and a single scan of an actual device to be wirebonded may be completed. In such an embodiment, at least a portion of interiors of the bond pads in the eyepoint may not be masked such that the interior of the bond pads may be scanned for ball bond shapes.

While the methods of determining if bond pads have been wirebonded have been described (and illustrated in the example of FIG. 20) in connection with wire loops (i.e., wire loops extending between a bond pad and a lead of a leadframe), it is understood that the wire bonds being checked may have varying forms such as conductive bumps (e.g., stud bumps or the like).

Figure 21:
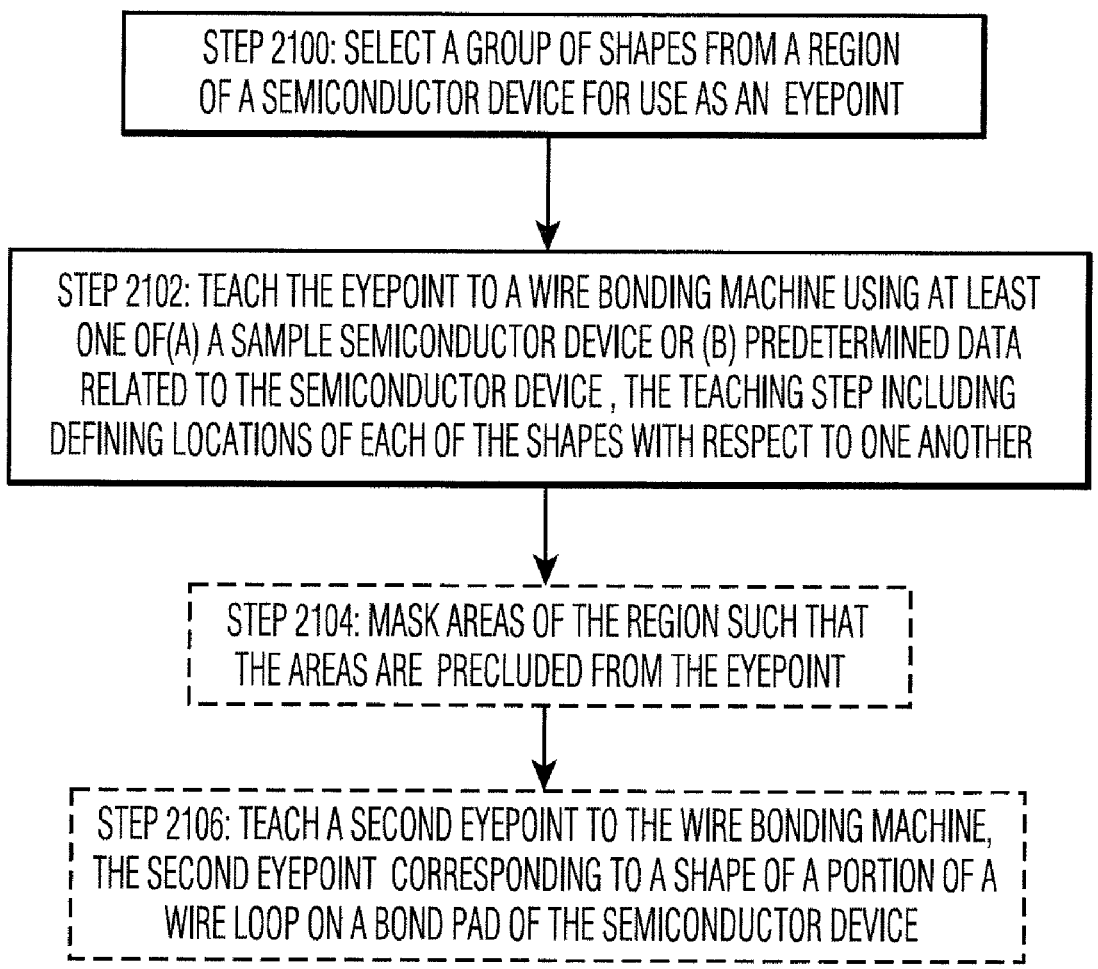
FIG. 21 is a flow diagram illustrating a method of teaching an eyepoint for a wire bonding operation in accordance with an exemplary embodiment of the present invention.
Figure 22:
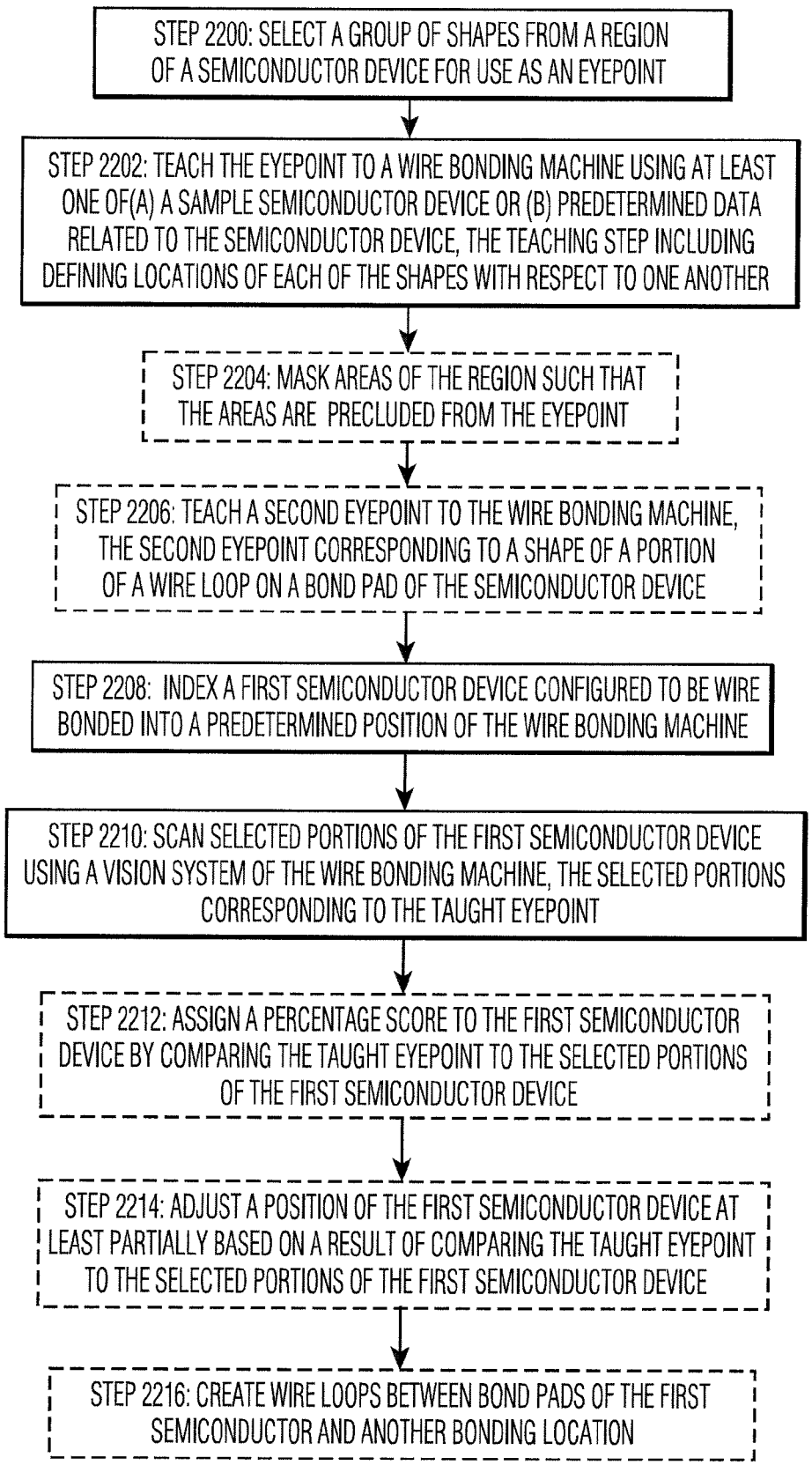
FIG. 22 is a flow diagram illustrating a method of operating a wire bonding machine in accordance with an exemplary embodiment of the present invention.

FIGS. 21-22 are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

More specifically, FIG. 21 is a flow diagram illustrating a method of teaching an eyepoint for a wire bonding operation in accordance with an exemplary embodiment of the present invention. At step 2100, a group of shapes is selected from a region of a semiconductor device for use as an eyepoint. For example, the group of shapes may include bond pad shapes, fiducial shapes, circuitry shapes, amongst others. At step 2102, the eyepoint is taught to a wire bonding machine using at least one of (a) a sample semiconductor device or (b) predetermined data related to the semiconductor device. This teaching step includes defining locations of each of the shapes with respect to one another. Such locations may be defined to include an area surrounding each of the group of shapes. The eyepoint may be defined to include the group of shapes while masking predetermined areas of the region (i.e., step 2104) such that the predetermined areas are precluded from the eyepoint. For example, such masking may include using an algorithm to preclude the location of the predetermined areas of the region from the eyepoint. Such masking may include masking at least one of (1) interior portions of selected bond pads, and (2) portions of the region between bond pads. At optional step 2106, a second eyepoint is taught to the wire bonding machine. The second eyepoint corresponds to a shape of a portion of a wire loop on a bond pad of the semiconductor device. For example, the shape of the portion of the wire loop may correspond to the shape of a ball bond of the wire loop.

FIG. 22 is a flow diagram illustrating a method of operating a wire bonding machine. Steps 2200, 2202, 2204, and 2206 of the illustrated method correspond to steps 2100, 2102, 2104, and 2106 of the flow diagram illustrated at FIG. 21. At step 2208, a first semiconductor device configured to be wire bonded is indexed into a predetermined position (e.g., the bond site) of the wire bonding machine. At step 2210, selected portions of the first semiconductor device are scanned using a vision system of the wire bonding machine, where the selected portions correspond to the taught eyepoint (e.g., the eyepoint taight at step 2202). At step 2212, a percentage score is assigned to the first semiconductor device by comparing the taught eyepoint to the selected portions of the first semiconductor device. Following step 2212, it may be determined that the position of the first semiconductor device should be adjusted prior to the wire bonding operation. At step 2214, a position of the first semiconductor device is adjusted at least partially based on a result of comparing the taught eyepoint to the selected portions of the first semiconductor device. At step 2216, wire loops are created (e.g., wire bonded) between bond pads of the first semiconductor and another bonding location. Thus, an improved operation of a wire bonding machine is provided.

As is understood by those skilled in the art, the first semiconductor device described above (e.g., described with respect to steps 2208, 2210, etc.) is not necessarily the first device indexed after the teach process. The term "first" is used simply to differentiate the device from the sample device described, for example, at step 2102. It is understood that a plurality of devices may be indexed, scanned, etc. in order to determine what an acceptable score is, and what is not an acceptable score.

Although the present invention has been described primarily with respect to (1) defining/teaching an eyepoint in a location of a sample device, and then (2) scanning the corresponding location of a device to be wire bonded to confirm that the device to be wire bonded is acceptable, it is not limited thereto. In certain applications, it may occur that the device (e.g., at the bond site) has moved, or that the orientation of the device at the bond site is not known. In such a situation, an eyepoint (i.e., that is defined/taught according to any exemplary embodiment of the present invention) may be found by scanning the device to be wirebonded. For example, if an eyepoint includes five (5) bond pads having predetermined shapes/sizes and predetermined locations with respect to one another (e.g., predetermined being through the teach process), the position of a semiconductor device to be wire bonded may be determined by scanning the device and locating a feature corresponding to the taught eyepoint. Of course, the teaching of such an eyeppoint may be accomplished through any of the exemplary methods described herein such as: (1) automatically generating the eyepoint (e.g., generated using a prior data), (2) generating the eyepoint using operator intervention, and/or (3) scanning a region of the device including the eyepoint (e.g., using a single field of view, using multiple fields of view aggregated, etc.).

Although the present invention has been described primarily with respect to eyepoints utilized to properly position and/or align a semiconductor device (e.g., a semiconductor die) prior to wire bonding (or other processing such as stud bumping, device inspection, etc) of the device, it is not limited thereto. The teachings provided herein are also applicable to teaching eyepoints for a variety of other applications. For example, it is typical to teach a leadframe or other substrate prior to wire bonding a semiconductor die thereto. Further, in some applications, a semiconductor die or leadframe may be taught prior to the semiconductor die being die-bonded to the leadframe. Thus, the methods described herein (e.g., portions of the methods illustrated in FIGS. 21-22) may also be applied to alignment done in connection with a die bonding operation. As such, the various exemplary embodiments of the present invention may also be applied to eyepoint recognition with respect to these and other applications.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of teaching an eyepoint for a wire bonding operation, the method comprising the steps of:
   (1) selecting a group of shapes from a region of a semiconductor device for use in teaching an eyepoint, the group of shapes including at least one of (a) bond pad shapes, (b) fiducial shapes, and (c) circuitry shapes; and
   (2) teaching the eyepoint to a wire bonding machine using at least one of (a) a sample semiconductor device, or (b) predetermined data related to the semiconductor device, wherein a respective one of the eyepoint of another semiconductor device to be wire bonded is configured to be scanned during a subsequent pattern recognition operation, the teaching step including defining locations of each of the shapes with respect to one another, the teaching step also including using an algorithm to preclude predetermined areas of the region from being included in the eyepoint such that the predetermined areas are at least one of (i) scanned and given no weight during the pattern recognition operation, (ii) scanned but given less weight than the eyepoint during the pattern recognition operation, and (iii) not scanned at all during the pattern recognition operation,
   the predetermined areas including at least one of (1) interior portions of each of the shapes, and (2) portions of the region between ones of the shapes.

2. The method of claim 1 wherein the predetermined areas are scanned and given no weight during the pattern recognition operation.

3. The method of claim 1 wherein the predetermined areas are scanned but given less weight than the eyepoint during the pattern recognition operation.

4. The method of claim 1 wherein the predetermined areas are not scanned at all during the pattern recognition operation.

5. The method of claim 4 wherein the group of shapes includes bond pad shapes such that the predetermined areas include at least one of (1) interior portions of the bond pad shapes, and (2) portions of the region between ones of the bond pad shapes.

6. The method of claim 1 wherein step (2) includes defining the locations of each of the shapes to include an area surrounding each of the shapes.

7. The method of claim 1 further comprising the step of (3) teaching a second eyepoint to the wire bonding machine, the second eyepoint corresponding to a shape of a portion of a wire loop on a bond pad of the semiconductor device.

8. The method of claim 7 wherein the shape corresponds to a shape of a ball bond of the wire loop.

9. The method of claim 1 wherein the eyepoint taught by the method is configured to be a back-up eyepoint of the wire bonding operation.

10. A method of operating a wire bonding machine, the method comprising the steps of:
    (1) selecting a group of shapes from a region of a semiconductor device for use in teaching an eyepoint, the group of shapes including at least one of (a) bond pad shapes, (b) fiducial shapes, and (c) circuitry shapes;
    (2) teaching the eyepoint to the wire bonding machine using at least one of (a) a sample semiconductor device, or (b) predetermined data related to the semiconductor device, wherein a respective one of the eyepoint of a first semiconductor device to be wire bonded is configured to be scanned during a subsequent pattern recognition operation, the teaching step including defining locations of each of the shapes with respect to one another, the teaching step also including using an algorithm to preclude predetermined areas of the region from being included in the eyepoint such that the predetermined areas are at least one of (i) scanned and given no weight during the pattern recognition operation, (ii) scanned but given less weight than the eyepoint during the pattern recognition operation, and (iii) not scanned at all during the pattern recognition operation,
    the predetermined areas including at least one of (1) interior portions of each of the shapes, and (2) portions of the region between ones of the shapes;
    (3) indexing the first semiconductor device configured to be wire bonded into a predetermined position of the wire bonding machine; and
    (4) scanning selected portions of the first semiconductor device in connection with the pattern recognition operation using a vision system of the wire bonding machine, the selected portions corresponding to the taught eyepoint.

11. The method of claim 10 wherein the predetermined areas are scanned and given no weight during the pattern recognition operation.

12. The method of claim 10 wherein the predetermined areas are scanned but given less weight than the eyepoint during the pattern recognition operation.

13. The method of claim 10 wherein the predetermined areas are not scanned at all during the pattern recognition operation.

14. The method of claim 13 wherein the group of shapes includes bond pad shapes such that the predetermined areas include at least one of (1) interior portions of the bond pad shapes, and (2) portions of the region between ones of the bond pad shapes.

15. The method of claim 10 wherein step (2) includes defining the locations of each of the shapes to include an area surrounding each of the shapes.

16. The method of claim 10 further comprising the step of (5) teaching a second eyepoint to the wire bonding machine, the second eyepoint corresponding to a shape of a portion of a wire loop on a bond pad of the semiconductor device.

17. The method of claim 16 wherein the shape corresponds to a shape of a ball bond of the wire loop.

18. The method of claim 10 wherein the eyepoint taught at step (2) is configured to be a back-up eyepoint of the wire bonding operation.

19. The method of claim 10 further comprising the step of (5) assigning a percentage score to the first semiconductor device by comparing the taught eyepoint to the selected portions of the first semiconductor device.

20. The method of claim 10 further comprising the step of (5) adjusting a position of the first semiconductor device at least partially based on a result of comparing the taught eyepoint to the selected portions of the first semiconductor device.

21. The method of claim 10 further comprising the step of (5) creating wire loops between bond pads of the first semiconductor and another bonding location.

* * * * *